(12) United States Patent
Fukami et al.

(10) Patent No.: US 8,120,950 B2
(45) Date of Patent: Feb. 21, 2012

(54) SEMICONDUCTOR DEVICE

(75) Inventors: Shunsuke Fukami, Tokyo (JP);
Nobuyuki Ishiwata, Tokyo (JP);
Tetsuhiro Suzuki, Tokyo (JP); Norikazu Ohshima, Tokyo (JP); Kiyokazu Nagahara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/920,194

(22) PCT Filed: Mar. 5, 2009

(86) PCT No.: PCT/JP2009/054130
§ 371 (c)(1),
(2), (4) Date: Aug. 30, 2010

(87) PCT Pub. No.: WO2009/110532
PCT Pub. Date: Sep. 11, 2009

(65) Prior Publication Data
US 2011/0002163 A1      Jan. 6, 2011

(30) Foreign Application Priority Data
Mar. 7, 2008   (JP) .................................. 2008-058734

(51) Int. Cl.
*G11C 11/15* (2006.01)
(52) U.S. Cl. .................. 365/173; 365/171; 365/158
(58) Field of Classification Search .............. 365/173, 365/158, 171
See application file for complete search history.

(56) References Cited

U.S. PATENT DOCUMENTS

| | | | | |
|---|---|---|---|---|
| 6,829,161 | B2 * | 12/2004 | Huai et al. ............... | 365/158 |
| 7,453,720 | B2 * | 11/2008 | Ju et al. .................. | 365/158 |
| 7,881,098 | B2 * | 2/2011 | Xi et al. .................. | 365/158 |

FOREIGN PATENT DOCUMENTS

| | | |
|---|---|---|
| JP | 2006073930 A | 3/2006 |
| JP | 2007103663 A | 4/2007 |
| JP | 2007258460 A | 10/2007 |
| WO | 2007119748 A | 10/2007 |

OTHER PUBLICATIONS

International Search Report for PCT/JP2009/054130 mailed Apr. 14, 2009.
N. Sakimura et al., "A 250-MHz 1-Mbit Embedded MRAM Macro Using 2T1MTJ Cell with sitline Separation and Half-Pitch Shift Architecture", IEEE Asian Solid-State Circuits Conference, Nov. 12-14, 2007, pp. 216-219.
N. Sakimura et al., "MRAM Cell Technology for Over 500-MHz SoC", IEEE Journal of Solid-State Circuits, vol. 42, No. 4, Apr. 2007, p. 830-838.

(Continued)

*Primary Examiner* — Connie Yoha

(57) ABSTRACT

A semiconductor device includes: a first magnetic random access memory including a first memory cell and a second magnetic random access memory including a second memory cell operating at higher speed than the first memory cell and is provided on the same chip together with the first magnetic random access memory. The first memory cell is a current-induced domain wall motion type MRAM and stores data based on a domain wall position of a magnetization free layer. A layer that a write current flows is different from a layer that a read current flows. The second memory cell is a current-induced magnetic field writing type MRAM and stores data based on a magnetic field induced by a write current.

14 Claims, 16 Drawing Sheets

OTHER PUBLICATIONS

H. Honjo et al., "Performance of write-line-inserted MTJ for low-write-current MRAM cell", 52nd Magnetism and Magnetic Materials Conference 2007 (MMM 2007), HP-01, pp. 481.

S. Fukami et al., "Micromagnetic analysis of current driven domain wall motion in nano-strips with perpendicular magnetic anisotropy", 52nd Magnetism and Magnetic Materials Conference 2007 (MMM 2007). FE-06, pp. 352.

M. Hayashi et al., "Current Driven Domain Wall Velocities Exceeding the Spin Angular Momentum Transfer Rate in Permalloy Nanowires", Physical Review Letters, vol. 98, Jan. 19, 2007, pp. 037204-1-4.

A. Thiaville et al., "Micromagnetic understanding of current-driven domain wall motion in patterned nanowires", Europhysics Letters, vol. 69, Mar. 15, 2005, pp. 990-996.

* cited by examiner

SEMICONDUCTOR DEVICE

This application is the National Phase of PCT/JP2009/054130, filed Mar. 5, 2009, which is based upon and claims the benefit of priority from Japanese patent application No. 2008-058734 filed on Mar. 7, 2008, the disclosure of which is incorporated herein in its entirety by reference.

TECHNICAL FIELD

The present invention relates to a semiconductor device, and particularly to a semiconductor device using a magneto-resistance effect element in a memory cell.

BACKGROUND ART

A magnetic random access memory (MRAM) is expected and actively developed as a nonvolatile memory capable of performing a high-speed operation and rewriting an infinite number of times. In the MRAM, a magneto-resistance effect element is integrated in a memory cell and data is stored as orientation of magnetization of a ferromagnetic layer in the magneto-resistance effect element. Some types of MRAMs are proposed to meet methods of switching the magnetization of the ferromagnetic layer.

A current-induced magnetic field write type MRAM is one of the most general MRAMs. In this MRAM, a wiring line that a write current passes through is installed on the periphery of the magneto-resistance effect element and the magnetization direction of the ferromagnetic layer in the magneto-resistance effect element is switched by a current magnetic field that occurs due to the passage of the write current. This MRAM can theoretically perform writing at a speed of 1 nanosecond or less and thus, is suitable for a high-speed MRAM. For example, a success of an operation at 250 MHz is demonstrated in one report (N. Sakimura et al., "A 250-MHz 1-Mbit Embedded MRAM Macro Using 2T1MTJ Cell with Bitline Separation and Half-Pitch Shift Architecture", Solid-State Circuits Conference, 2007, ASSCC' 07, IEEE Asian p. 216). Further, a circuit configuration suitable for an operation at 500 MHz is proposed (N. Sakimura et al., "MRAM Cell Technology for Over 500-MHz SoC", IEEE JOURNAL OF SOLID-STATE CIRCUITS, Vol, 42, 2007, p. 830).

However, a magnetic field for switching magnetization of a magnetic body having secured thermal stability and resistance to external disturbing magnetic field is generally a few dozens of [Oe]. In order to generate such magnetic field, a large write current of about a few mA is needed. Even the smallest write current among reported write currents is about 1 mA (H. Honjo et al., "Performance of write-line-inserted MTJ for low-write-current MRAM cell", 52nd Magnetism and Magnetic Materials Conference 2007 (MMM 2007), p. 481). When the write current is large, the chip area is necessarily large and power consumed for writing increases. In addition, when a size of the memory cell is miniaturized, the write current further increases and scaling is not applicable.

As for other MRAMs, a spin-polarized current write type MRAM is exemplified. In this MRAM, a spin-polarized current is injected into a ferromagnetic conductor of the magneto-resistance effect element and magnetization is switched due to a direct interaction between spin of conduction electrons that bear the current and a magnetic moment of the conductor (hereinafter referred to as "spin transfer magnetization switching"). Generating of the spin transfer magnetization switching depends on a current density (rather than a current absolute value). Accordingly, when the spin transfer magnetization switching is utilized for data writing, as the size of the memory cell decreases, the write current is also reduced. In other words, the spin transfer magnetization switching method is excellent in scaling performance. When the write current is small, the chip area becomes small, enabling higher integration and larger structure. However, as compared to the current-induced magnetic field write type MRAM, a write time period tends to be longer (ex. 1 nanosecond or more).

DISCLOSURE OF INVENTION

In a semiconductor device having a logic and a memory therein, such as a system LSI (Large-Scale Integration) (hereinafter also referred to as "memory-embedded semiconductor device"), there are an area that requires a high-speed operation and an area that requires large capacity and high integration (that is, low write current) and a memory is provided in each of the areas. For example, a register or a cache is provided as a memory in the area that requires the high-speed operation, and a main storage device or an auxiliary storage device is provided as a memory in the area that requires large capacity and high integration. Because performances and functions necessary for the memories are different from each other, only one type of memory cannot meet the need. Accordingly, until now, at least one selected from plural types of memories (FF (Flip-Flop), SRAM (Static Random Access Memory), DRAM (Dynamic Random Access Memory), flash memory and the like) has been used in the area that requires the high-speed operation and at least another one of the memories has been used in the area that requires large capacity and high integration, respectively. However, in this case, because materials and processes which are used in the memories are different from each other, the number of processes increases. As a result, this can cause problems such as an increase in manufacturing costs, an increase in a manufacturing time period and lowering of manufacturing yields.

Therefore, an object of the present invention is to provide a memory-embedded semiconductor device that can perform both high-speed processing and large capacity processing in an internal memory.

A semiconductor device of the present invention includes: a first magnetic random access memory that includes a first memory cell and a second magnetic random access memory that includes a second memory cell operating at higher speed than the first memory cell and is provided on the same chip together with the first magnetic random access memory. The first memory cell includes a first magnetization free layer, a second magnetization free layer, a first nonmagnetic layer provided adjacent to the second magnetization free layer and a first magnetization pinned layer provided adjacent to the first nonmagnetic layer and on an opposite side to the second magnetization free layer. The first magnetization free layer is formed of a ferromagnetic material and has magnetic anisotropy in a film thickness direction. Each of the second magnetization free layer and the first magnetization pinned layer is formed of a ferromagnetic material and has in-plane magnetic anisotropy. The first magnetization free layer includes: a first magnetization pinned region having pinned magnetization, a second magnetization pinned region having pinned magnetization and a magnetization free region that is connected to the first magnetization pinned region and the second magnetization pinned region and has invertible magnetization. The magnetization free region is magnetically coupled to the second magnetization free layer. A center of gravity of the magnetization free region is shifted from a center of gravity of the second magnetization free layer in a certain direction as an in-plane direction. The magnetization of the first magnetization pinned layer is pinned to a direction substantially parallel to the certain direction. The second memory cell includes a third magnetization free layer, a third magnetization pinned layer and a second nonmagnetic layer provided between the third magnetization free layer and the third magnetization pinned layer. Each of the third magnetization free layer and the third magnetization pinned layer is formed of a ferromagnetic material.

BEST MODE FOR CARRYING OUT THE INVENTION

Figure 1:
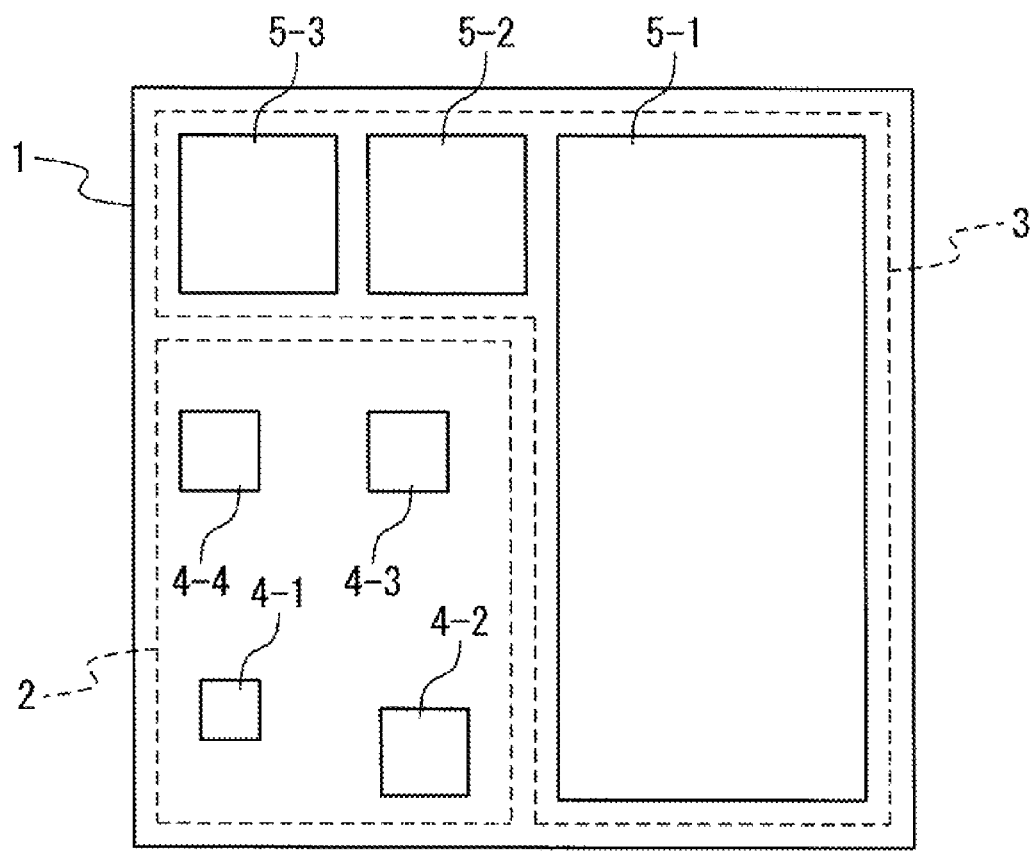
FIG. 1 is a schematic view illustrating a configuration of a semiconductor device according town exemplary embodiment of the present invention.

An exemplary embodiment of a semiconductor device according to the present invention will be described. FIG. 1 is a schematic view illustrating a configuration of the semiconductor device according town exemplary embodiment of the present invention. The semiconductor device 1 in the present exemplary embodiment is a memory-embedded semiconductor device. The semiconductor device 1 is exemplified by a memory-embedded LSI formed on one chip and includes a logic portion 2 and a memory portion 3.

The logic portion 2 is a region requiring a high-speed operation and has logic circuits for performing logic operations. The logic portion 2 further includes MRAMs 4-1 to 4-4 capable of performing a high-speed operation. Each of the MRAMs 4-1 to 4-4 is exemplified by a current-induced magnetic field write type MRAM and used as a register, an L1 cache (primary cache), or a L2 cache (secondary cache). Hereinafter, when the MRAMs need not be discriminated from each other, the MRAMs are abbreviated as merely MRAM 4.

As described above, the current-induced magnetic field write type MRAM can theoretically perform writing at a speed of 1 nanosecond or less. Thus, the current-induced magnetic field write type MRAM is suitable as the MRAM capable of performing the high-speed operation. Since a write current is generally large, an area of the MRAM becomes relatively large. However, since the MRAM is used as a memory having a relatively small capacity such as the register, the L1 cache or the L2 cache, an effect of the area of the MRAM on the area of the whole chip is extremely small.

The memory portion 3 is a region requiring large capacity and high integration (that is, low write current) and has storage circuits for storing data therein. Large capacity and high integration MRAMs 5-1 to 5-3 are included as the storage circuits. Each of the MRAMs 5-1 to 5-3 is exemplified by a spin-polarized current write type MRAM and used as a main storage device or an auxiliary storage device. Hereinafter, when the MRAMs need not be discriminated from each other, the MRAMs are abbreviated as merely MRAM 5.

The spin-polarized current write type MRAM is exemplified by a current-induced domain wall motion type MRAM.

In the current-induced domain wall motion type MRAM, the magneto-resistance effect element is generally formed of a laminated body having a first ferromagnetic layer for holding data (often referred to as a magnetic recording layer), a second ferromagnetic layer with a pinned magnetization (often referred to as a magnetization pinned layer) and a tunnel barrier layer provided between these ferromagnetic layers. The magnetic recording layer includes a magnetization switching portion having invertible magnetization and two magnetization pinned portions which are respectively connected to both ends of the magnetization switching portion and have pinned magnetization. Data is stored as magnetization of the magnetization switching portion. Magnetizations of the two magnetization pinned portions are pinned so as to be substantially antiparallel to each other. With such arrangement of magnetizations, a domain wall is introduced into the magnetic recording layer. When a current flows in a direction of penetrating the domain wall, the domain wall moves to a direction of the spin-polarized conduction electrons (Domain Wall Motion), and therefore, data can be written by the current flowing through the magnetic recording layer. In this case, the magneto-resistance effect element is a three-terminal element having two terminals respectively connected to both ends of the magnetic recording layer and a terminal connected to the magnetization pinned layer. Since the write current does not flow into the tunnel barrier layer in this MRAM, durability, life and reliability are improved.

For example, another report demonstrates that domain wall motion at 0.05 mA can be achieved in the current-induced domain wall motion type MRAM (S. Fukami et al., "Micromagnetic analysis of current driven domain wall motion in nano-strips with perpendicular magnetic anisotropy", 52nd Magnetism and Magnetic Materials Conference 2007 (MMM 2007), p. 352). Still another report shows that the domain wall motion velocity is proportional to the current density and is about 100 m/s at maximum (M. Hayashi et al., "Current Driven Domain Wall Velocities Exceeding the spin Angular Momentum Transfer Rate in Permalloy Nanowires", Physical Review Letters, vol. 98, p. 037204 (2007)). In this case, motion of 100 nm takes 1 nanosecond.

The current-induced domain wall motion type MRAM is excellent in the scaling performance as described above and is suitable for the MRAM capable of achieving higher integration and a larger scale. Further, although this type of MRAM has a relatively low operational speed, since it is used as a memory such as a main storage device or an auxiliary storage device that does not require the high-speed operation as compared to a register, the effect is extremely small.

When all storage elements of the logic portion 2 and the memory portion 3 are nonvolatile MRAMs in the above-mentioned semiconductor device 1, even in a power-off sate, data can be continually held in these MRAMs, which is preferable. In this case, power-off can be made a basic state (instant-on). Whereby, power consumption can be reduced.

Further, when the all storage elements of the logic portion 2 and the memory portion 3 are nonvolatile MRAMs in the above-mentioned semiconductor device 1, the storage elements can be manufactured according to the same process, which is preferable. By manufacturing different types of MRAMs based on the same process, the semiconductor device 1 can be manufactured at lower costs and in a shorter time.

The semiconductor device of the present invention is not limited to the configuration shown in FIG. 1. In other words, shape, arrangement and the like of the logic portion 2 and the memory portion 3 as well as the number of MRAMs in each portion, and shape, arrangement and the like of the MRAM can be freely changed within the scope of technical idea of the present invention.

Figure 2:
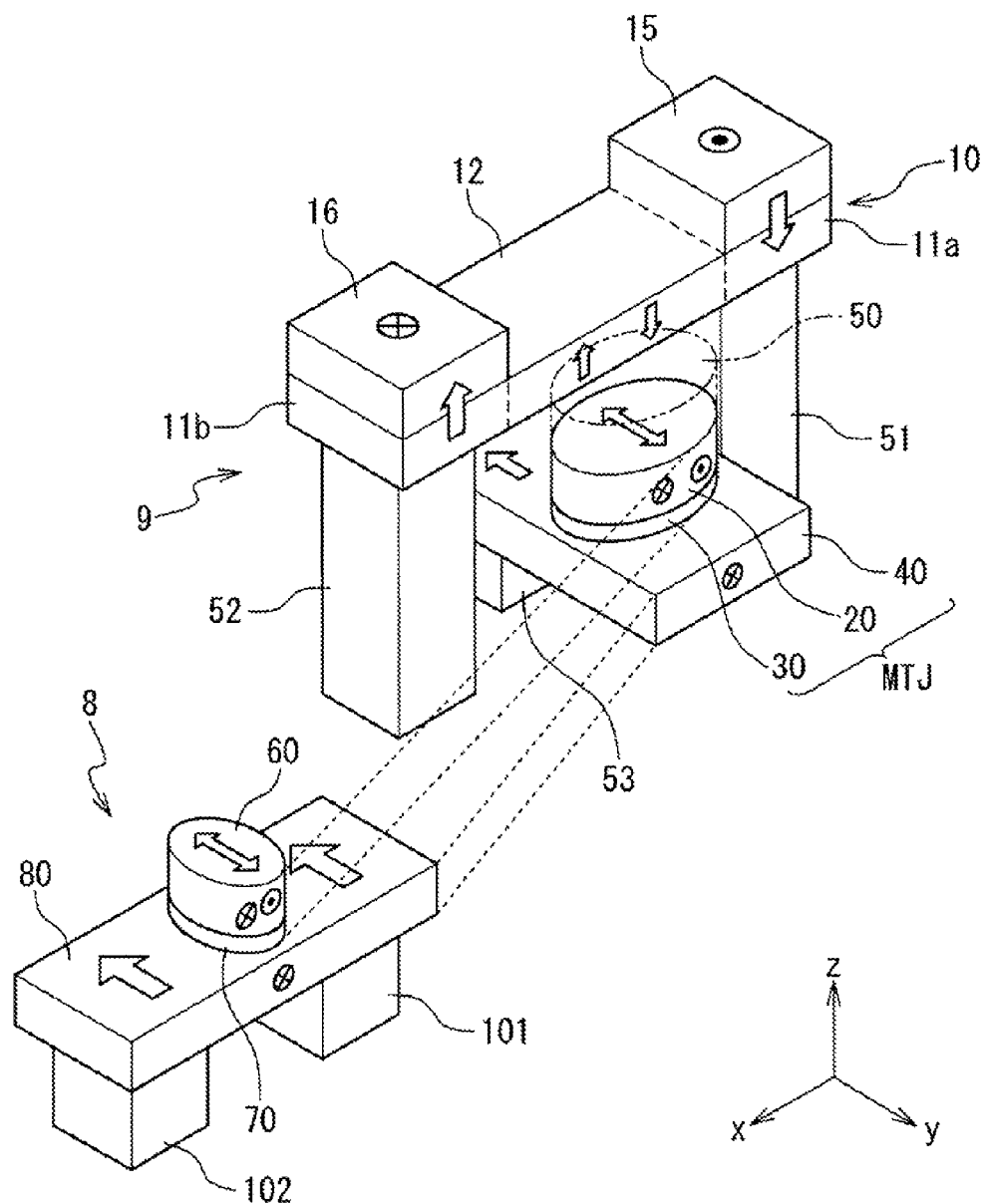
FIG. 2 is a perspective view illustrating configurations of magneto-resistance effect elements in respective MRAMs according to the exemplary embodiment of the present invention.

Next, configurations of the magneto-resistance effect elements in respective MRAMs according to the exemplary embodiment of the present invention will be described. FIG. 2 is a perspective view illustrating the configurations of the magneto-resistance effect elements in respective MRAMs according to the exemplary embodiment of the present invention. A magneto-resistance effect element 8 and a magneto-resistance effect element 9 according to the exemplary embodiment of the present invention are formed on the same chip. Here, each hollow arrow, each symbol of a circle with an x-mark and each symbol of a circle with a black spot in each configuration in the figure represent orientation of magnetization (the same shall apply hereinafter).

The magneto-resistance effect element 8 is a current-induced magnetic field write type magneto-resistance effect element used in a memory cell of the MRAM 4 for the high-speed operation (an operational frequency is desirably 200 MHz or higher). The magneto-resistance effect element 8 includes a magnetization free layer 60, a magnetization pinned layer 80, and a nonmagnetic layer 70 provided between the magnetization free layer 60 and the magnetization pinned layer 80. Although not shown, it is desired that an electrode layer, an anti-diffusion layer and a ground layer in addition to the above-mentioned layers are provided as appropriate.

Each of the magnetization free layer 60 and the magnetization pinned layer 80 is formed of a ferromagnetic material. Each of the magnetization free layer 60 and the magnetization pinned layer 80 is an in-plane magnetization film having magnetic anisotropy (in-plane magnetic anisotropy) in an in-plane direction (in-xy plane direction). In the present exemplary embodiment, the nonmagnetic layer 70 is formed of an insulator, and the magnetization free layer 60, the nonmagnetic layer 70 and the magnetization pinned layer 80 constitute magnetic tunnel junction (MTJ). Although the nonmagnetic layer 70 is desirably formed of an insulator, it may be formed of a semiconductor or a conductor. Specific materials for the magnetization free layer 60, the nonmagnetic layer 70 and the magnetization pinned layer 80 will be described later.

The magnetization pinned layer 80 has pinned magnetization. This pinned magnetization is set to be a direction vertical to a longitudinal direction (x direction) of the magnetization pinned layer 80 or have a vertical direction component. The magnetization free layer 60 has invertible magnetization. A magnetization easy axis of the magnetization free layer 60 is set to be a direction vertical to the longitudinal direction (x direction) of the magnetization pinned layer 80 or have a vertical direction component. Such magnetic anisotropy can be given by shape magnetic anisotropy.

When the pinned magnetization of the magnetization pinned layer 80 and the magnetization easy axis of the magnetization free layer 60 are set as described above, magnetization of the magnetization free layer 60 can have either a parallel component or an antiparallel component relative to the magnetization of the magnetization pinned layer 80. In the magneto-resistance effect element 8 in the present exemplary embodiment, the magnetization direction of the magnetization free layer 60 corresponds to stored data.

Next, a method of writing data to the magneto-resistance effect element 8 in the present exemplary embodiment will be described. First, the write current is passed to the magnetization pinned layer 80. The current-induced magnetic field generated by the write current switches the magnetization of the magnetization free layer 60. At this time, by controlling a direction of the current-induced magnetic field generated in a direction of the write current, the magnetization of the magnetization free layer 60 can be changed to a desired direction. Thereby, desired data is recorded on the magnetization free layer 60. The magnetization pinned layer 80 is also referred to as a base electrode by reason of its function. Thus, such a writing method of passing the write current to the magnetization pinned layer 80, namely the base electrode can be also referred to as a base write type. According to this method, since the write current is directly passed to the magneto-resistance effect element 8, magnitude of the current-induced magnetic field become relatively large. For this reason, the Write current can be made small. Further, the write current is introduced into the magnetization pinned layer 80, it is desired that an electrical resistance is relatively small. To this end, a conductive layer may be provided adjacent to the magnetization pinned layer 80, thereby lowering the electrical resistance.

Next, a method of reading data from the magneto-resistance effect element 8 in the present exemplary embodiment will be described. First, a read current is passed between the magnetization pinned layer 80 and the magnetization free layer 60 through the nonmagnetic layer 70. Then, data is read by detecting change of the resistance that corresponds to a relative angle between the magnetization of the magnetization pinned layer 80 and the magnetization of the magnetization free layer 60. For example, when the magnetization of the magnetization pinned layer 80 is parallel to the magnetization of the magnetization free layer 60 (ex., store "0"), a low resistance state is achieved, and when the magnetization of the magnetization pinned layer 80 is antiparallel to the magnetization of the magnetization free layer 60 (ex., store "1"), a high resistance state is achieved. The change of the resistance of the magneto-resistance effect element 8 is detected as a voltage signal or a current signal and data stored in the magneto-resistance effect element 8 is determined using the voltage signal or the current signal.

The magneto-resistance effect element 9 is a spin-polarized current write type and a current-induced domain wall motion type magneto-resistance effect element used in a memory cell of the MRAM 5 for high integration and large capacity (low current; it is desired that the write current is 0.5 mA or less). This magneto-resistance effect element 9 includes a first magnetization free layer 10, a second magnetization free layer 20, a first nonmagnetic layer 30 and a first magnetization pinned layer 40. The second magnetization free layer 20 is provided adjacent to one surface of the first nonmagnetic layer 30 and the first magnetization pinned layer 40 is provided adjacent to the other surface of the first nonmagnetic layer 30. The first magnetization free layer 10 may be electrically connected to the second magnetization free layer 20 through a conductive layer 50 as shown or directly without interposing the conductive layer 50 therebetween. Although not shown, it is desired that an electrode layer, an anti-diffusion layer and a ground layer in addition to the above-mentioned layers are provided as appropriate.

The first magnetization free layer 10 includes: a first magnetization pinned region 11a having pinned magnetization, a second magnetization pinned region 11b having pinned magnetization and a magnetization free region 12 that is connected to the first magnetization pinned region 11a and the second magnetization pinned region 11b and has invertible magnetization. The magnetization of the first magnetization pinned region 11a is pinned by a magnetization pinned layer 15 provided thereon. The magnetization of the Second magnetization pinned region 11b is pinned by the magnetization pinned layer 16 provided thereon.

Each of the first magnetization free layer 10, the second magnetization free layer 20 and the first magnetization pinned layer 40 is formed of a ferromagnetic material. The first magnetization free layer 10 is a perpendicular magnetization film having magnetic anisotropy (perpendicular magnetic anisotropy) in a film thickness direction (z direction). Each of the second magnetization free layer 20 and the first magnetization pinned layer 40 is an in-plane magnetization film having magnetic anisotropy (in-plane magnetic anisotropy) in the in-plane direction (in-xy plane direction). The direction of the magnetization easy axis of the second magnetization free layer 20 is arbitrary. In the present exemplary embodiment, the first nonmagnetic layer 30 is formed of an insulator, and the second magnetization free layer 20, the first nonmagnetic layer 30 and the first magnetization pinned layer 40 constitute magnetic tunnel junction (MTJ). Although the first nonmagnetic layer 30 is preferably formed of the insulator, it may be formed of a semiconductor or a conductor.

The magneto-resistance effect element 8 and the magneto-resistance effect element 9 according to the exemplary embodiment of the present invention are formed on the same chip. The magnetization free layer 60, the nonmagnetic layer 70 and the magnetization pinned layer 80 of the magneto-resistance effect element 8, and the second magnetization free layer 20, the first nonmagnetic layer 30 and the first magnetization pinned layer 40 of the magneto-resistance effect element 9 are simultaneously formed on the same layers by use of the same materials. That is, the MRAM 4 and the MRAM 5 can be formed according to the same process and the number of processes does not increase. Whereby, the semiconductor device 1 can be manufactured at lower costs and in a shorter time.

Next, the magneto-resistance effect element 9 in the present exemplary embodiment will be described in more detail.

Figure 3A:
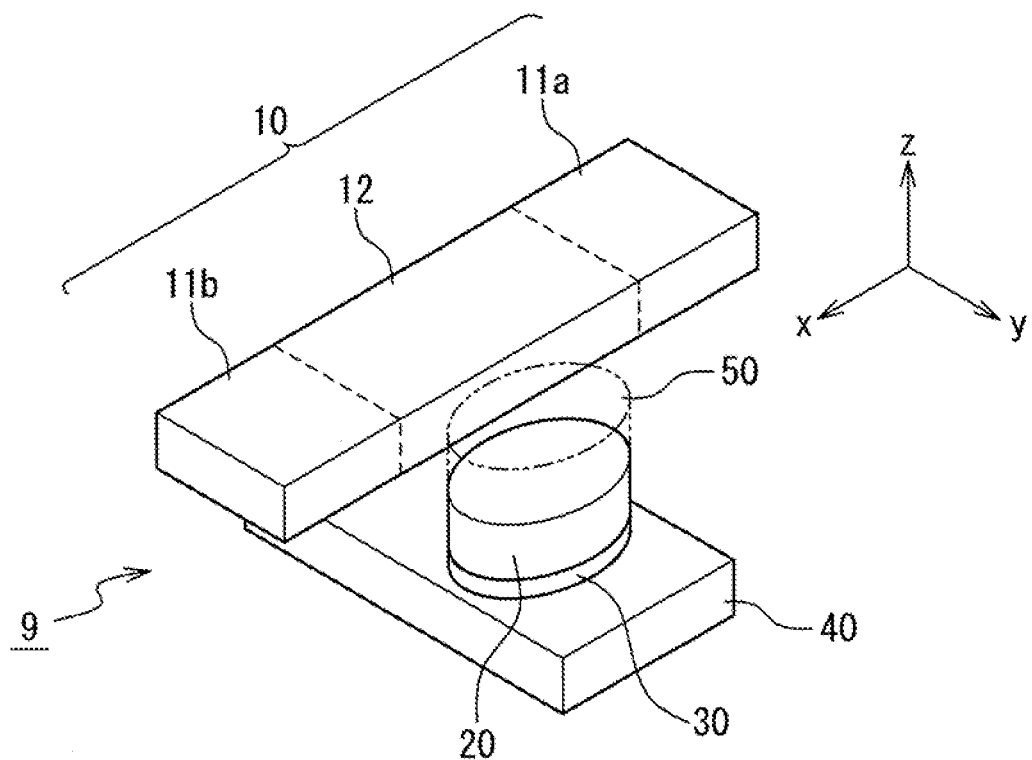
FIG. 3A is a perspective view illustrating a structure of a main part of the magneto-resistance effect element in the present exemplary embodiment.
Figure 3B:
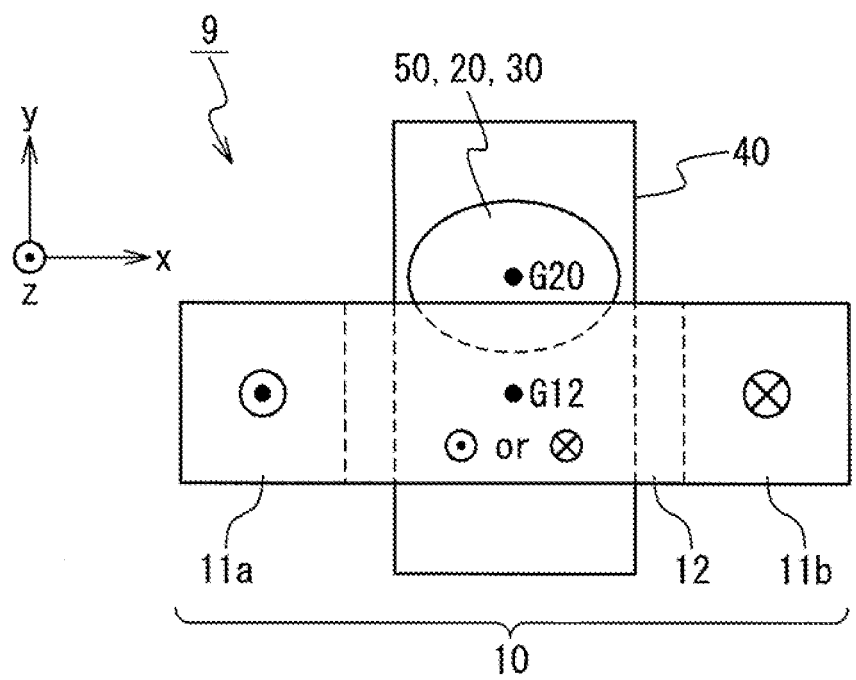
FIG. 3B is a plan view illustrating a structure of the main part of the magneto-resistance effect element in the present exemplary embodiment.
Figure 3C:
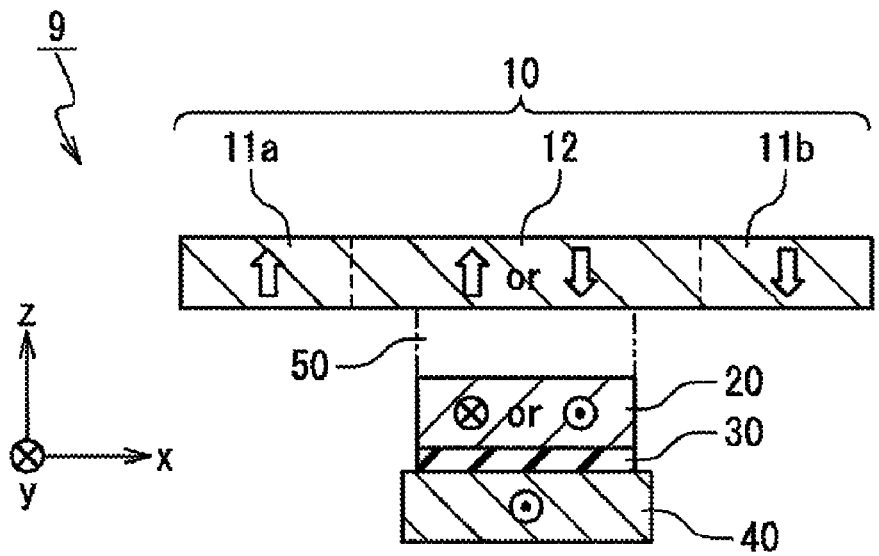
FIG. 3C is a sectional view illustrating a structure of the main part of the magneto-resistance effect element in the present exemplary embodiment.
Figure 3D:
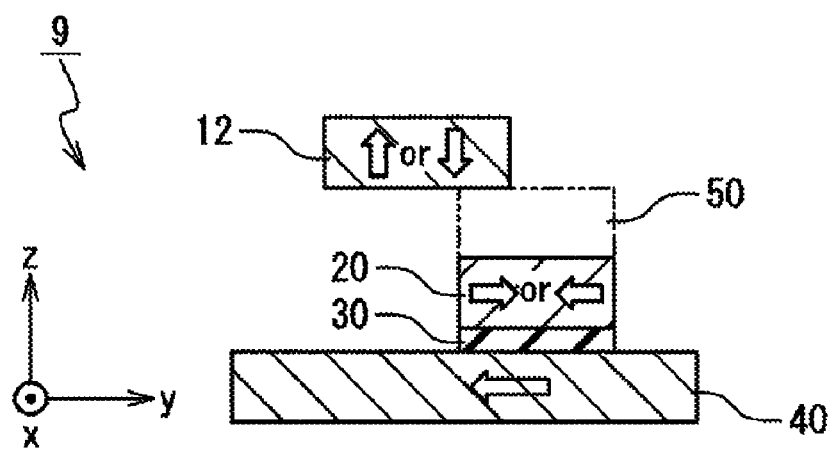
FIG. 3D is a sectional view illustrating a structure of the main part of the magneto-resistance effect element in the present exemplary embodiment.

FIG. 3A to FIG. 3D are schematic views illustrating a configuration of the magneto-resistance effect element 9 according to the exemplary embodiment of the present invention. Describing in detail, FIG. 3A is a perspective view and FIGS. 3B, 3C and 3D are an xy plan view, an xz sectional view and a yz sectional view in an xyz coordinate system shown in FIG. 3A, respectively. The magneto-resistance effect element 9 has a laminated structure formed of a plurality of layers and the laminating direction is defined as a z-axis direction. A plane parallel to each layer of the laminated structure is an xy plane.

In the magneto-resistance effect element 9 in the present exemplary embodiment, the first magnetization free layer 10 is formed of the first magnetization pinned region 11a, the second magnetization pinned region 11b and the magnetization free region 12. The magnetization free region 12 is provided between the first magnetization pinned region 11a and the second magnetization pinned region 11b. The first magnetization free layer 10 is designed so that the magnetization free region 12 is magnetically coupled to at least a part of the second magnetization free layer 20. In other words, the first magnetization free layer 10 is designed so that a magnetization state of the magnetization free region 12 has an effect on a magnetization state of the second magnetization free layer 20. The magnetization free region 12 is provided so that it is also electrically connected to the second magnetization free layer 20. The electrical connection may be performed through the conductive layer 50 (FIG. 2) or directly.

Each of the first magnetization pinned region 11a and the second magnetization pinned region 11b has pinned magnetization at least a part thereof. In the present exemplary embodiment, the pinned regions are pinned by the magnetization pinned layers 15, 16 provided thereon, respectively. The magnetizations of the first magnetization pinned region 11a and the second magnetization pinned region 11b are pinned in the film thickness direction (z direction in the figure) and are oriented in the substantially antiparallel direction to each other. The magnetization of the magnetization free region 12 is invertible and is substantially parallel to the magnetization of the first magnetization pinned region 11a or the second magnetization pinned region 11b. In the magneto-resistance effect element 9 in the present exemplary embodiment, the magnetization direction of the magnetization free region 12 corresponds to stored data.

The second magnetization free layer 20 has invertible magnetization in the in-plane direction (in-xy plane direction) and the first magnetization pinned layer 40 has magnetization pinned in a predetermined direction in the in-plane direction (in-xy plane direction).

As described above, the magnetization free region 12 is magnetically coupled to the second magnetization free layer 20. Preferably, it is designed so that a center of gravity G12 of the magnetization free region 12 is shifted from a center of gravity G20 of the second magnetization free layer 20 in xy plane. Thus, as described later, the magnetization direction of the second magnetization free layer 20 is uniquely determined based on the magnetization direction of the magnetization free region 12. Accordingly, data stored as the magnetization direction of the magnetization free region 12 is transmitted to the second magnetization free layer 20 through magnetic coupling between the magnetization free region 12 and the second magnetization free layer 20. Although FIGS. 3A to 3D illustrate the example in which the center of gravity G20 of the second magnetization free layer 20 is shifted from the center of gravity G12 of the magnetization free region 12 in a +y direction, generally, the direction in which the center of gravity G20 of the second magnetization free layer 20 is shifted from the center of gravity G12 of the magnetization free region 12 in the xy plane only needs to be substantially parallel to the direction in which the magnetization of the second magnetization free layer 20 is invertible. It is desired that the magnetization of the first magnetization pinned layer 40 is pinned in a direction substantially parallel to the direction in which the center of gravity G20 of the second magnetization free layer 20 is shifted from the center of gravity G12 of the magnetization free region 12 in the xy plane.

The center of gravity used herein refers to a center of gravity in the xy plane in a geometrical sense. That is, given that a position vector of the center of the gravity is Rg=(Xg, Yg) and a position vector of any point i is Ri=(Xi, Yi), the position vector of the center of the gravity Rg satisfies $\Sigma i(Ri-Rg)=0$. Here, $\Sigma i$ means a total sum with respect to i. For example, the center of gravity in the case of a rectangle or a parallelogram is an intersection of diagonal lines and the center of gravity in the case of an ellipse is the center of the ellipse.

The conductive layer 50 is provided between the first magnetization free layer 10 and the second magnetization free layer 20. The conductive layer 50 is formed of a conductor. The conductive layer 50 may be a magnetic body or a non-magnetic body. In the case of the magnetic body, a relatively soft magnetic body is preferable. The conductive layer 50 may be also formed of a laminated film made of a plurality of materials. The conductive layer 50 also has a function to electrically connect the first magnetization free layer 10 to the second magnetization free layer 20.

The conductive layer 50 may be provided on only an upper surface of the second magnetization free layer 20 as shown or may be provided so as to cover a lower surface of the first magnetization free layer 10 and the whole upper surface of the second magnetization free layer 20, although not shown. Although not shown, the conductive layer 50 may be provided so as to cover at least a part of the first magnetization free layer 10 and the second magnetization free layer 20.

By providing the conductive layer 50, the manufacturing process can be simplified. This is due to that the upper conductive layer 50 and the lower conductive layer 50 can be separately formed. At this time, the conductive layer 50 acts as a cap layer (protective layer) for the layer under the conductive layer 50 as well as a ground layer for the layer on the conductive layer 50. Whereby, it is possible to prevent the layer under the conductive layer 50 from oxidizing or chemically transforming, control a crystalline orientation of the layer on the conductive layer 50 and prevent the layer on the conductive layer 50 from chemically transforming. Further, by providing the conductive layer 50, electrical contact between the first magnetization free layer 10 and the second magnetization free layer 20 can be improved.

When the conductive layer 50 is made of a magnetic material, data on the magnetization of the magnetization free region 12 of the first magnetization free layer 10 can be efficiently transmitted to the second magnetization free layer 20. For this reason, the conductive layer 50 is preferably made of a material with a high magnetic permeability. Whereby, the magnetization of the second magnetization free layer 20 can be inverted more easily. In order to efficiently transmit information on the magnetization of the magnetization free region 12 to the second magnetization free layer 20 by use of the conductive layer 50, it is desired that the material for the conductive layer 50 contains at least one of Fe, Co and Ni.

A metal layer corresponding to such conductive layer 50 may be formed on the magnetization free layer 60 in the magneto-resistance effect element 8. The metal layer functions as a cap layer (protective layer) in connecting a contact for connection to upper wiring to the magnetization free layer 60. In this case, since the conductive layer 50 and the metal layer can be manufactured according to the same process, the number of processes does not increase.

A material for each layer will be exemplified below. Note that all materials described herein are only examples and any material may be adopted as long as the above-mentioned magnetization state can be achieved in fact.

First, it is desired that the first magnetization free layer 10 contains at least one material selected from Fe, Co and Ni. When Pt or Pd is further contained, perpendicular magnetic anisotropy can be stabilized. It can be adjusted so that a desired magnetic characteristic appears by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au or Sm. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co and Gd—Tb—Fe—Co are exemplified. Alternatively, magnetic anisotropy in the vertical direction can be developed by laminating a layer containing any one material selected from Fe, Co and Ni and a different layer. Specifically, laminated films such as Co/Pd, Co/Pt, Co/Ni, Fe/Au are exemplified.

It is desired that the second magnetization free layer 20 and the first magnetization pinned layer 40 contain at least one material selected from Fe, Co and Ni. It can be adjusted so that a desired magnetic characteristic appear by adding B, C, N, O, Al, Si, P, Ti, V, Cr, Mn, Cu, Zn, Zr, Nb, Mo, Tc, Ru, Rh, Ag, Hf, Ta, W, Re, Os, Ir or Au. Specifically, Ni—Fe, Co—Fe, Fe—Co—Ni, Ni—Fe—Zr, Co—Fe—B and Co—Fe—Zr—B are exemplified.

The first nonmagnetic layer 30 is desirably formed of an insulator. Examples of a suitable material for the first nonmagnetic layer 30 include Mg—O, Al—O, Al—N, Ni—O and Hf—O. However, even when a semiconductor or a metal material is used for the first nonmagnetic layer 30, the present invention can be implemented. Specifically, examples of a material that can be adopted as the first nonmagnetic layer 30 include Cr, Al, Cu and Zn.

It is preferred that the materials for the second magnetization free layer 20, the first nonmagnetic layer 30 and the first magnetization pinned layer 40 that have a large magnetic resistance effect ratio corresponding to an SN ratio of a read signal are selected. For example, in Co—Fe—B/Mg—O/Co—Fe—B based MTJ, a very large magnetic resistance effect ratio of about 500% has been recently reported. From this viewpoint, it is desired that the second magnetization free layer 20 and the first magnetization pinned layer 40 are made of a Co—Fe—B based material and the first nonmagnetic layer 30 is made of a Mg—O based material.

The magnetization free layer 60, the nonmagnetic layer 70 and the magnetization pinned layer 80 of the magneto-resistance effect element 8 can be made of the same materials as those of the second magnetization free layer 20, the first nonmagnetic layer 30 and the magnetization pinned layer 40, respectively. When the magneto-resistance effect element 8 and the magneto-resistance effect element 9 are manufactured according to the same process, the materials for the magnetization free layer 60, the nonmagnetic layer 70 and the magnetization pinned layer 80 are the same as the materials for the second magnetization free layer 20, the first nonmagnetic layer 30 and the magnetization pinned layer 40, respectively.

Figure 4A:
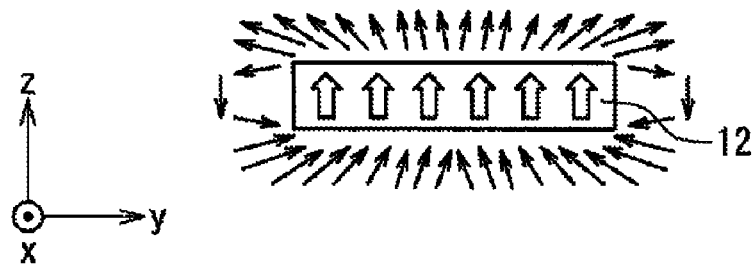
FIG. 4A is a sectional view for describing a state of a magnetic flux in the magneto-resistance effect element in the present exemplary embodiment.

Magnetic coupling between the magnetization free region 12 and the second magnetization free layer 20 and two possible states of magnetization in the magneto-resistance effect element 9 will be described with reference to FIGS. 4A to 4C in more detail. FIG. 4A is a schematic view for describing that the magnetization direction of the second magnetization free layer 20 is uniquely determined by the magnetization direction of the magnetization free region 12. For simplification, it is assumed that in FIG. 4A, the magnetization of the magnetization free region 12 is oriented substantially in one direction, that is, the film thickness direction and in FIGS. 4B and 4C, the conductive layer 50 is omitted. FIG. 4A schematically illustrates a state of a leakage flux from the magnetization free region 12. As shown in FIG. 4A, since the leakage flux needs to be smoothly connected, the magnetic flux has components that become more parallel to the in-plane direction (in-xy plane direction) as it comes closer to ends of the magnetization free region 12. The magnetization direction of the second magnetization free layer 20 is determined by the components parallel to the in-plane direction of the magnetic flux.

Figure 4B:
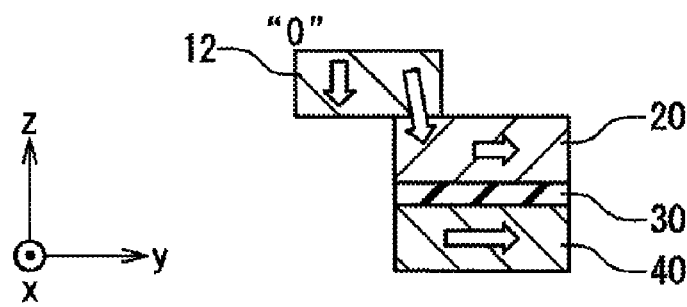
FIG. 4B is a sectional view for describing two possible states of the magneto-resistance effect element in the present exemplary embodiment.
Figure 4C:
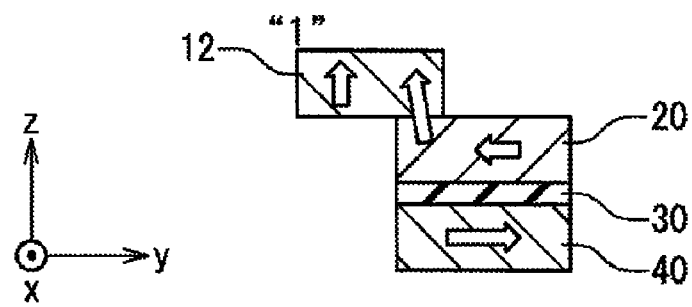
FIG. 4C is a sectional view for describing the two possible states of the magneto-resistance effect element in the present exemplary embodiment.

FIGS. 4B and 4C schematically illustrate magnetization states of each layer in a "0" state and a "1" state in the magneto-resistance effect element, respectively. Although the magnetization direction of the first magnetization pinned layer 40 is pinned in the +y direction in FIGS. 4B and 4C, the magnetization direction of the first magnetization pinned layer 40 may be pinned in a −y direction. When the magnetization of the magnetization free region 12 is oriented in the −z direction as shown in FIG. 4B, the magnetization of the second magnetization free layer 20 has a component in the +y direction due to the leakage flux reversely oriented to that in FIG. 9A. Whereby, the magnetization of the second magnetization free layer 20 and the magnetization of the first magnetization pinned layer 40 have parallel components to each other. On the contrary, when the magnetization of the magnetization free region 12 is oriented in the +z direction as shown in FIG. 4C, the magnetization of the second magnetization free layer 20 has a component in the −y direction due to the leakage flux as shown in FIG. 4A. Whereby, the magnetization of the second magnetization free layer 20 and the magnetization of the first magnetization pinned layer 40 have antiparallel components to each other. Since the center of gravity G20 of the second magnetization free layer 20 is shifted from the center of gravity G12 of the magnetization free region 12 in a certain direction as described above, the magnetization of the second magnetization free layer 20 has a component in a positive or negative direction along the certain direction, depending on the magnetization direction of the magnetization free region 12. This is due to that components in the in-plane direction of the leakage flux are radially distributed from the center of gravity G12 of the magnetization free region 12. The magnetization of the second magnetization free layer 20 and the magnetization of the first magnetization pinned layer 40 can be in the states having one of a parallel component and an antiparallel component.

That the data stored as the magnetic component in the vertical direction in the magnetization free region 12 is transmitted to the magnetic component in a film plane direction of the second magnetization free layer 20 by magnetic coupling is one of important features of the magneto-resistance effect element 9 in the present exemplary embodiment. Therefore, the magnetization of the second magnetization free layer 20 may be associated with the magnetization of the magnetization free region 12 based on any magnetic coupling method other than the method of using the leakage flux described herein, for example, by using exchange coupling.

As long as the magnetization direction of the second magnetization free layer 20 can be freely changed based on the magnetization of the magnetization free region 12, the direction of the magnetization easy axis of the second magnetization free layer 20 is arbitrary. Accordingly, the magnetization easy axis of the second magnetization free layer 20 may be oriented in the y direction or the x direction. When the easy axis is oriented in the y direction, the magnetization is switched in the magnetization easy axis. When the easy axis is oriented in the x direction, the magnetization is rotated about the magnetization easy axis to a hard axis direction.

Further, it is desired that magnetic anisotropy of the second magnetization free layer 20 is not extremely large. The reason is as follows: when the magnetic anisotropy is extremely large, magnetization switching by the leakage flux from the magnetization free region 12 becomes difficult. The magnetic anisotropy of the second magnetization free layer 20 may be crystal magnetic anisotropy or shape magnetic anisotropy. The second magnetization free layer 20 may be a laminated film formed of a plurality of ferromagnetic layers. A layer formed of a nonmagnetic body may be inserted between the ferromagnetic layers so as not to disturb the magnetization state.

Next, an operating method, in particular, a writing method and a reading method, of the magneto-resistance effect element 9 in the present exemplary embodiment will be described.

First, the writing method will be described. Writing of data to the magneto-resistance effect element 9 in the present exemplary embodiment is performed by moving the domain wall formed in the first magnetization free layer 10. As described above, the first magnetization free layer 10 includes the first magnetization pinned region 11a and the second magnetization pinned region 11b, whose magnetizations are pinned substantially antiparallel to each other in the film thickness direction, and the magnetization free region 12 electrically connected to the pinned regions, and the magnetization of the magnetization free region 12 is substantially parallel to the magnetization of the first magnetization pinned region 11a or the second magnetization pinned region 11b. By such limitation of the magnetization state, the domain wall is inserted into the first magnetization free layer 10. For example, when the magnetization of the magnetization free region 12 is substantially parallel to the magnetization of the first magnetization pinned region 11a and is substantially antiparallel to the magnetization of the second magnetization pinned region 11b, the domain wall is formed in the vicinity of a boundary between the magnetization free region 12 and the second magnetization pinned region 11b. When the magnetization of the magnetization free region 12 is substantially parallel to the magnetization of the second magnetization pinned region 11b and is substantially antiparallel to the magnetization of the first magnetization pinned region 11a, the domain wall is formed in the vicinity of a boundary between the magnetization free region 12 and the first magnetization pinned region 11a.

The formed domain wall can be moved by directly passing a current into the first magnetization free layer 10. For example, when the domain wall is formed in the vicinity of the boundary between the magnetization free region 12 and the first magnetization pinned region 11a, by passing a current from the magnetization free region 12 toward the first magnetization pinned region 11a, conduction electrons flow from the first magnetization pinned region 11a to the magnetization free region 12, thereby moving the domain wall in the same direction as the flow of the conduction electrons. As a result of motion of the domain wall, the magnetization of the magnetization free region 12 becomes parallel to the magnetization of the first magnetization pinned region 11a. When the domain wall is formed in the vicinity of the boundary between the magnetization free region 12 and the second magnetization pinned region 11b, by passing a current from the magnetization free region 12 toward the second magnetization pinned region 11b, conduction electrons flow from the second magnetization pinned region 11b to the magnetization free region 12, thereby moving the domain wall in the same direction as the flow of the conduction electrons. As a result of the motion of the domain wall, the magnetization of the magnetization free region 12 becomes parallel to the magnetization of the second magnetization pinned region 11b. Rewriting of information between the state "0" and the state "1" can be performed.

Writing of "1" in the state "0" and writing of "0" in the state "1" are achieved in this manner. Although not shown, writing of "0" in the state "0" and writing of "1" in the state "1", that is, overwriting, are possible.

In fact, in order to introduce the above-mentioned write current, it is desired that each of the first magnetization pinned region 11a and the second magnetization pinned region 11b is provided with a terminal connected to external wiring line. At this time, the write current is passed between a first terminal connected to the first magnetization pinned region 11a and a second terminal connected to the second magnetization pinned region 11b. However, a path of the write current for writing data to the magneto-resistance effect element 9 in the present exemplary embodiment is not limited to this and another method will be described later.

Next, the method of reading data from the magneto-resistance effect element 9 in the present exemplary embodiment will be described. Reading of the data from the magneto-resistance effect element 9 in the present exemplary embodiment is performed by using the magnetic resistance effect. Specifically, the date is read by passing a current between the first magnetization pinned layer 40 and the second magnetization free layer 20 through the first nonmagnetic layer 30 and detecting change of resistance that corresponds to a relative angle between the magnetization of the first magnetization pinned layer 40 and magnetization of the second magnetization free layer 20. For example, when the magnetization of the first magnetization pinned layer 90 is parallel to the magnetization of the second magnetization free layer 20 as shown in FIG. 4B (ex., store "0"), the low resistance state is achieved, and when the magnetization of the first magnetization pinned layer 90 is antiparallel to the magnetization of the second magnetization free layer 20 as shown in FIG. 4C (ex., store "1"), the high resistance state is achieved. The change of the resistance in the magneto-resistance effect element is detected as a voltage signal or a current signal, and data stored in the magneto-resistance effect element is determined by using the voltage signal or the current signal.

Figure 5A:
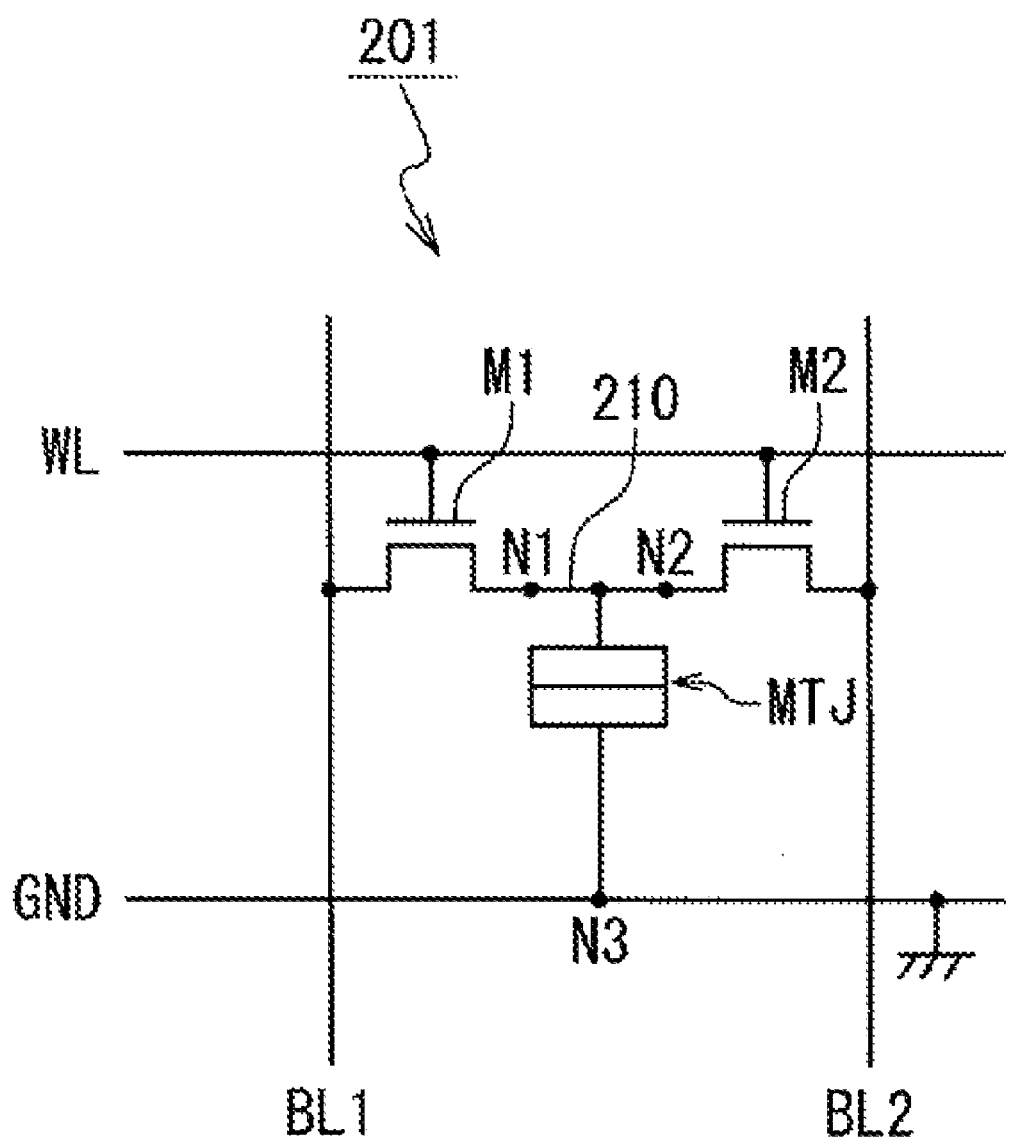
FIG. 5A is a circuit diagram illustrating an example of a configuration of a memory cell in which the magneto-resistance effect element in the present exemplary embodiment is integrated.
Figure 5B:
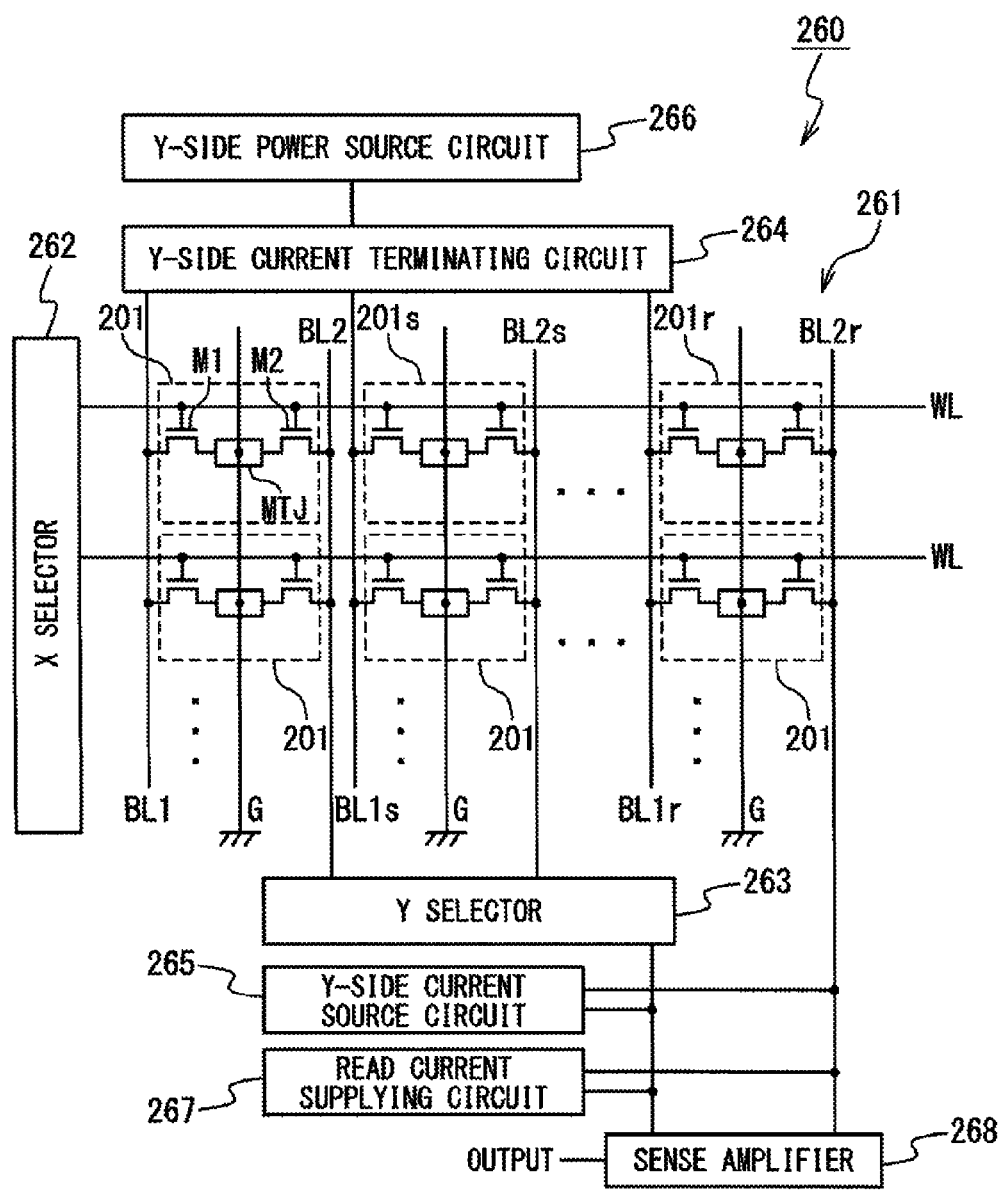
FIG. 5B is a block diagram illustrating an example of a configuration of an MRAM in which the memory cells in the present exemplary embodiment are integrated.

Next, a circuit configuration of a memory cell 201 in the MRAM 5 in the present exemplary embodiment will be described with reference to FIGS. 5A and 5B. In FIGS. 5A and 5B, the magneto-resistance effect element 9 is used as a storage element of the memory cell 201. The circuit configuration is similarly applied to the memory cell 201 (magneto-resistance effect element 8 is used as the storage element) of the MRAM 4 in the present exemplary embodiment.

FIG. 5A is a circuit diagram illustrating an example of a configuration of a memory cell in which the magneto-resistance effect element in the present exemplary embodiment is integrated. Although FIG. 5A illustrates a circuit configuration of one memory cell 201, those skilled in the art would understand that a plurality of memory cells 201 are arranged in an array and integrated in the MRAM 5 (or 4) in fact.

In the case of the magneto-resistance effect element 9, in FIG. 5A, a terminal connected to the first magnetization pinned layer 40 is connected to a ground line GND for reading through a node N3. One of two terminals connected to the first magnetization free layer 10 is connected to one source/drain of a MOS transistor M1 through a node N1 and the other of the two terminals is connected to one source/drain of a MOS transistor M2 through a node N2. The other sources/drains of the MOS transistors M1, M2 are connected to bit lines BL1, BL2 for writing, respectively. Further, gate electrodes of the MOS transistors M1, M2 are connected to a word line WL. That is, "210" in the figure corresponds to the first magnetization free layer 10.

In the case of the magneto-resistance effect element 8, in FIG. 5A, one of two terminals connected to both ends of the magnetization pinned layer 80 is connected to one source/drain of the MOS transistor M1 through the node N1 and the other of the two terminals is connected to one source/drain of the MOS transistor M2 through the node N2. A terminal connected to the magnetization free layer 60 is connected to the ground line GND for reading through the node N3. That is, "210" in the figure corresponds to the magnetization pinned layer 80.

FIG. 5B is a block diagram illustrating an example of a configuration of an MRAM in which the memory cells in the present exemplary embodiment are integrated. In FIG. 5B, an MRAM 260 includes a memory cell array 261 in which the plurality of memory cells 201 is arranged in a matrix. The memory cell array 261 includes the memory cells 201 used to record data shown in FIG. 5A as well as reference cells 201r referred to in reading the data. A structure of the reference cell 201r is the same as that of the memory cell 201.

The word lines WL are connected to an X selector 262. The X selector 262 selects the word line WL connected to a target memory cell 201s in the data writing operation and the data reading operation as a selected word line WLs. A bit line BL1 is connected to a Y-side current terminating circuit 264 and a bit line BL2 is connected to a Y selector 263. The Y selector 263 selects the bit line BL2 connected to the target memory cell 201s in the data writing operation and the data reading operation as a selected bit line BL2s. The Y-side current terminating circuit 264 selects the bit line BL1 connected to the target memory cell 201s as a selected bit line BL1s.

In the data writing operation, a Y-side current source circuit 265 supplies or draws a predetermined write current (Iwrite) to the selected bit line BL2s. In the data writing operation, a Y-side power source circuit 266 supplies a predetermined voltage to the Y-side current terminating circuit 264. As a result, the write current (Iwrite) flows into the Y selector 263 or flows out of the Y selector 263. The X selector 262, the Y selector 263, the Y-side current terminating circuit 264, the Y-side current source circuit 265 and the Y-side power source circuit 266 constitute a "write current supply circuit" for supplying the write current (Iwrite) to the memory cell 201.

In the data reading operation, a read current supplying circuit 267 supplies a predetermined read current (Iread) to the selected second bit line BL2s. The Y-side current terminating circuit 264 sets the bit line BL1 to "Open". The read current supplying circuit 267 supplies the predetermined read current (Iread) to a reference bit line BL2r connected to the reference cell 201r. A sense amplifier 268 reads data from the target memory cell 201s based on a difference between a potential of the reference bit line BL2r and a potential of the selected bit line BL2s and outputs the data. The X selector 262, the Y selector 263, the Y-side current terminating circuit 264, the read current supplying circuit 267 and the sense amplifier 268 constitute a "read current supply circuit" for supplying the read current (Iread) to the memory cell 201.

Next, a writing method and a reading method in the MRAM shown in FIGS. 5A and 5B will be described. First, in writing data, the word line WL is pulled up to a "high" level and the MOS transistors M1, M2 are turned "ON". One of the bit lines BL1, BL2 is pulled up to a "high" level and the other is pulled down to a "Low" level. Which of the bit lines BL1, BL2 is pulled up to a "high" level and is pulled down to a "Low" level is determined depending on the data to be written in the magneto-resistance effect element 9 (or the magneto-resistance effect element 8). That is, it is determined depending on the direction of the current flowing in the first magnetization free layer 10 (or the magnetization pinned layer 80). As described above, data "0" and data "1" can be distinguished in writing.

In reading data, the word line WL is pulled up to a "high" level and the MOS transistors M1, M2 are turned "ON". The bit line BL2 is pulled up to a "high" level and the bit line BL1 is set to "open" (floating). At this time, the read current penetrating the magneto-resistance effect element 9 (or the magneto-resistance effect element 8) flows from the bit line BL2 to the ground line GND through the first magnetization free layer 10, the second magnetization tree layer 20, the first nonmagnetic layer 30, and the first magnetization pinned layer 40 (or the magnetization pinned layer 80, the nonmagnetic layer 70 and the magnetization free layer 60). A potential of the bit line to which the read current flows or magnitude of the read current depends on the change of the resistance of the magneto-resistance effect element 9 (or the magneto-resistance effect element 8) due to the magnetic resistance effect. By detecting the change of the resistance as a voltage signal or a current signal, reading at high speed becomes possible.

However, the circuit configurations shown in FIGS. 5A and 5B and the circuit operations described herein are merely examples for a method of implementing the present invention and the present invention can be implemented by using the other circuit configurations.

It has been reported that when the circuit configuration in FIG. 5A is applied to the current-induced magnetic field write type magneto-resistance effect element 8, the operation at 200 MHz or higher is achieved (N. Sakimura et al., IEEE JOURNAL OF SOLID-STATE CIRCUITS, Vol. 42, 2007, p. 830). However, in order to perform a higher operation, the other circuit configuration as shown in FIG. 6 can be adopted.

Figure 6:
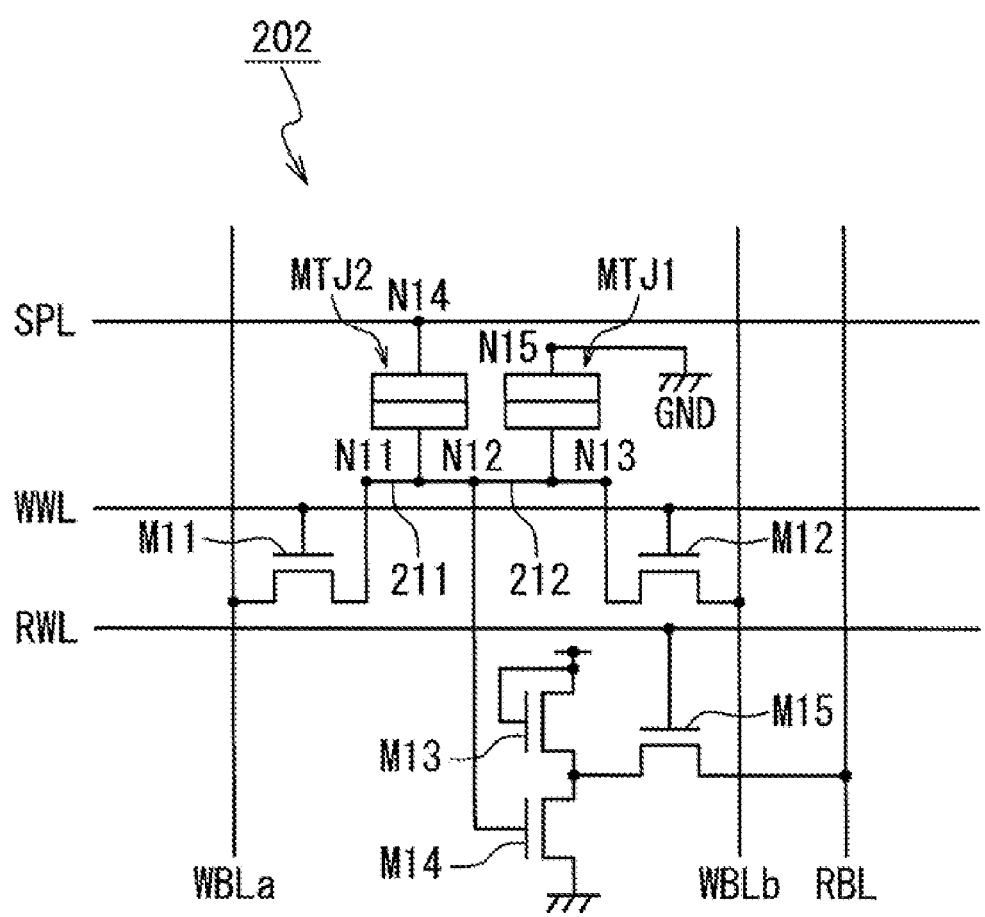
FIG. 6 is a circuit diagram illustrating an example of another configuration of the memory cell in which the magneto-resistance effect elements in the present exemplary embodiment are integrated.

FIG. 6 is a circuit diagram illustrating an example of another configuration of a memory cell in which the magneto-resistance effect elements in the present exemplary embodiment are integrated. Although FIG. 6 illustrates the circuit configuration of one memory cell 202, those skilled in the art would understand that a plurality of memory cells 202 are arranged in an array and integrated in the MRAM. It is reported that when the circuit configuration in FIG. 6 is applied to the current-induced magnetic field write type magneto-resistance effect element 8, the operation at 500 MHz or higher become possible (N. Sakimura et al., IEEE JOURNAL OF SOLID-STATE CIRCUITS, Vol. 42, 2007, p. 830).

In FIG. 6, two MTJ 1 and MTJ 2 are used in one memory cell 202. The MTJ 1 and the MTJ 2 store complementary data ("0" and "1" or "1" and "0") therein. In addition, a read signal is amplified in the memory cell 202 by MOS transistors M13, M14.

When first and second magneto-resistance effect elements 8 are used as the MTJ 1 and the MTJ 2, in the second magneto-resistance effect element 8 (MTJ 2), one of two terminals connected to both ends of the magnetization pinned layer 80 is connected to one source/drain of a MOS transistor M11 through a node N11 and the other of the two terminals is connected to one end of the magnetization pinned layer 80 of the first magneto-resistance effect element 8 (MTJ 1) through a node N12. A terminal connected to the magnetization free layer 60 is connected to a wiring line SPL for supplying the read current through a node N19. In the first magneto-resistance effect element 8 (MTJ 1), one of two terminals connected to the both ends of the magnetization pinned layer 80, is connected to the other end of the magnetization pinned layer 80 of the second magneto-resistance effect element 8 (MTJ 2) through the node N12 and the other of the two terminals is connected to one source/drain of the MOS transistor M12 through a node N13. A terminal connected to the magnetization free layer 60 is connected to the ground line GND for reading through a node N15. That is, "211", "212" in the figure correspond to the magnetization pinned layers 80 of the second and first magneto-resistance effect elements 8, respectively.

When first and second magneto-resistance effect elements 9 are used as the MTJ 1 and the MTJ 2, in the second magneto-resistance effect element 9 (MTT2), a terminal connected to the first magnetization pinned layer 40 is connected to the wiring line SPL for supplying the read current. One of two terminals of the first magnetization free layer 10 is connected to one source/drain of the MOS transistor M11 through the node N11 and the other of the two terminals is connected to one end of the first magnetization free layer 10 of the first magneto-resistance effect element 9 (MTJ 1) through the node N12. In the first magneto-resistance effect element 9 (MTJ 1), the terminal connected to the first magnetization pinned layer 40 is connected to the ground line GND for reading. One of two terminals connected to the first magnetization free layer 10 is connected to the other end of the first magnetization free layer 10 of the second magneto-resistance effect element 9 (MTJ 2) through the node N12 and the other of terminals is connected to one source/drain of the MOS transistor M12 through the node N13. That is, "211", "212" in the figure correspond to the first magnetization free layers 10 of the second and first magneto-resistance effect elements 9, respectively.

Next, a writing method and a reading method of the MRAM shown in FIG. 6 will be described. First, in performing writing, a word line WWL is pulled up to a "high" level and the MOS transistors M11, M12 are turned "ON". One of bit lines WBLa, WBLb is pulled up to a "high" level and the other is pulled down to a "Low" level. Which of the bit lines WBLa, WBLb is pulled up to a "high" level and is pulled down to a "Low" level is determined depending on data to be written to the MTJ 1 and the MTJ 2. That is, it is determined depending on the direction of the current flowing in the two first magnetization free layers 10 (or the two magnetization pinned layers 80). Whereby, complementary data ("0" and "1" or "1" and "0") is stored in the MTJ 2 and the MTJ 1.

In performing reading, a word line RWL is pulled up to a "high" level and a MOS transistor M15 is turned. "ON". Further, a read voltage supply line SPL is pulled up to a "high" level. At this time, the read current passing along a path through the node N14, the MTJ 2, the node N12, the MTJ 1 and the node N15 flows from the read voltage supply line SPL to the ground line GND through the first magnetization free layer 10, the second magnetization free layer 20, the first nonmagnetic layer 30 and the first magnetization pinned layer 40 of the MTJ 1 and the MTJ 2 (or the magnetization pinned layer 80, the nonmagnetic layer 70 and the magnetization free layer 60 of the MTJ 1 and the MTJ 2). At this time, the potential of the node N12 between the MTJ 2 and the MTJ 1 depends on the complementary data stored in the MTJ 2 and the MTJ 1. Therefore, by amplifying the potential of the node N12 by the MOS transistors M13, M14 and detecting the amplified potential by a bit line RBL, reading at high speed becomes possible.

The circuit configuration shown in FIG. 6 and the circuit operations described herein are merely examples for a method of implementing the present invention, and the present invention can be implemented by using the other circuit configurations.

A first technical advantage of the magneto-resistance effect element 9 in the present exemplary embodiment is reduction of the write current. This is due to that the first magnetization free layer 10 as a layer where domain wall motion takes place in writing data has perpendicular magnetic anisotropy. By performing micromagnetics calculation using an LLG equation in consideration of spin transfer torque, the inventors found that a domain wall made of a material having perpendicular magnetic anisotropy has a much smaller current density needed for a current driving and a much larger magnetic field needed for a magnetic field driving than a domain wall made of a material having in-plane magnetic anisotropy.

According to "Micromagnetic understanding of current-driven domain wall motion in patterned nanowires", A. Thiaville et al., Europhysics Letters, vol. 69, p. 990-996 (2005), the LLG equation in consideration of spin transfer torque is as follows (Refer to the equation (3) on p. 992).

$$\frac{\partial \vec{m}}{\partial t} = \gamma_0 \vec{H} \times \vec{m} + \alpha \vec{m} \times \frac{\partial \vec{m}}{\partial t} - (\vec{u} \cdot \vec{\nabla})\vec{m} + \beta \vec{m} \times [(\vec{u} \cdot \vec{\nabla})\vec{m}]$$ [Equation 1]

Given that a left side is time change of magnetization (∂m/∂t), a right side is configured of [1] a term representing torque by magnetic field, [2] a damping term, [3] an adiabatic spin torque term and [4] a non-adiabatic spin torque term. According to the micromagnetics calculation, it turns out that the domain wall made of the material having perpendicular magnetic anisotropy is driven by [3] the adiabatic spin torque term even at a current density of about $1 \times 10^8$ [A/cm$^2$], while a domain wall formed of the in-plane magnetization film is not driven without [4] the non-adiabatic spin torque term at the current density of about $1 \times 10^8$ [A/cm$^2$]. Here, in the case of a domain wall driving by [3] the adiabatic spin torque term, it is known that when pinning is not excessively large, the domain wall can be depinned from a pin site without depending on a pinning magnetic field. Accordingly, as compared to the material having in-plane magnetic anisotropy that cannot achieve the domain wall driving by [3] the adiabatic spin torque term, the material having perpendicular magnetic anisotropy that can achieve the domain wall driving by [3] the adiabatic spin torque term can easily satisfy both strong pinning of a domain wall and domain wall motion by a low current density. That is, by using the material having perpendicular magnetic anisotropy, a current needed for writing can be reduced while keeping an appropriate value of thermal stability.

For example, as a simple example, a configuration is assumed in which a width (w) of the magneto-resistance effect element is 100 nm, a film thickness (t) of the first magnetization free layer 10 is 2 nm, a half (q0) of a width of the pin site of the domain wall is 15 nm, a saturation magnetization (MS) of the first magnetization free layer 10 is 500 [emu/cm$^3$], a spin polarizability (P) is 0.5 and a depin magnetic field (HC) of the pin site of the domain wall is 1000 [Oe]. A thermal stability indicator $\Delta E/k_B T$ in this case is about 40. Here, $k_B$ is Boltzman's constant and T is an absolute temperature. According to the micromagnetics calculation, it has turned out that the current density needed to depin the domain wall from the pin site in the assumption of such system is about $2 \times 10^7$ [A/cm$^2$]. At this time, the write current of the element is 0.04 [mA].

Meanwhile, as a structure for achieving the same thermal stability indicator ($\Delta E/k_B T=40$) by using the material having in-plane magnetic anisotropy, for example, a configuration is assumed in which a width (w) of the magneto-resistance effect element is 100 nm, a film thickness (t) of the magnetization free layer is 10 nm, a half (q0) of a width of the pin site of the domain wall is 90 nm, a saturation magnetization (MS)

of the first magnetization free layer 10 is 800 [emu/cm$^3$], a spin polarizability (P) is 0.7 and a depin magnetic field (HC) of the pin site of the domain wall is 50 [Oe]. According to the micromagnetics calculation, it has turned out that the current density needed to depin the domain wall from the pin site in such system is about 6×10$^8$ [A/cm$^2$]. Although it is fundamentally unrealistic to use such current density in the element in terms of heat generation and electromigration effect, here, this current density value is used for comparison. At this time, a write current to the element in the in-plane magnetic film becomes 6 [mA]. As described above, it turns out that the write current can be greatly reduced by using the material having perpendicular magnetic anisotropy for the layer where the domain wall motion occurs.

The parameters of the magneto-resistance effect element used herein are only rough targets and the parameters of the magneto-resistance effect element can be variously changed. Although the current value needed for writing and thermal stability $\Delta E/k_B T$ change according to the change of the parameters, the current value and the thermal stability change almost cooperatively and therefore, magnitude relationship between the in-plane magnetization film and the perpendicular magnetization film described above in terms of the write current does not greatly change.

Furthermore, according to the micromagnetics calculation, it has turned out that in the material having perpendicular magnetic anisotropy, as distinct from the material having in-plane magnetic anisotropy, as the film thickness is smaller, the current density needed to drive the domain wall by a current is reduced. When the film thickness is decreased, the total current amount is reduced. However, use of the material having perpendicular magnetic anisotropy can further decrease the current density, thereby effectively reducing the write current.

A second technical advantage of the magneto-resistance effect element 9 in the present exemplary embodiment is an increase in the read signal. This is due to that the data stored in the first magnetization free layer 10 having perpendicular magnetic anisotropy is transmitted to the second magnetization free layer 20 having in-plane magnetic anisotropy and the MTJ for reading is formed of a ferromagnetic layer having the magnetization in the film plane direction. By using a Co—Fe—B/Mg—O/Co—Fe—B based material or an equivalent material for the ferromagnetic layer forming the MTJ, a much higher MR ratio can be achieved.

A third technical advantage of the magneto-resistance effect element 9 in the present exemplary embodiment is resolution of trade-off between writing and reading and simplification of the manufacturing process. This is due to that the first magnetization free layer 10 for writing and the second magnetization free layer 20 for reading can be individually designed. For example, in the general magnetic field write type MRAM, when a material having a high spin polarizability such as Co—Fe is used to make the read signal large, magnetic anisotropy of the element generally becomes large, and thus, the current needed for writing increases. In the magneto-resistance effect element in the present exemplary embodiment, since reduction of the write signal and increase in the read signal can be achieved by adjusting characteristics of each layer, the above-mentioned trade-off is resolved. In addition, since the first magnetization free layer 10 and the second magnetization free layer 20 can be separately manufactured, the manufacturing process is simplified.

A fourth technical advantage of the magneto-resistance effect element 9 in the present exemplary embodiment is reduction of costs as a result of omission of a magnetic shield or reduction of requirements of the magnetic shield. This is due to that since the material having perpendicular magnetic anisotropy for the first magnetization free layer 10 as an information storage layer has a sufficient large crystal magnetic anisotropy, resistance to the external disturbing magnetic field is extremely larger as compared to the in-plane magnetization film. Under present circumstances, the material having in-plane magnetic anisotropy practically requires the magnetic shield. However, according to the present invention, the magnetic shield is not required to ensure the resistance to external disturbing magnetic field, or even the magnetic shield is required, since performance requirements of the magnetic shield are reduced, manufacturing at lower costs can be achieved.

According to the present invention, in the memory-embedded semiconductor device, suitable types of MRAMs are selected and arranged based on required functions. For example, the current-induced magnetic field write type MRAM capable of performing the high-speed operation is used as a memory for the logic circuit that requires the high-speed operation, and the current-induced domain wall motion type MRAM enabling a lower current operation (larger capacity and higher integration) is used as a memory for the main storage device that requires a low current (large capacity and high integration). Whereby, a nonvolatile memory-embedded system (memory-embedded semiconductor device) that satisfy both the high-speed processing and the large capacity processing can be obtained.

According to the present invention, since the memory cell is nonvolatile, power-off can be made a basic state (instant-on), thereby enabling lower power consumption. Further, even when different types of MRAMs are mounted on the same chip, the MRAMs can be manufactured by using the same process with the same materials. Thereby, the semiconductor device can be manufactured at lower costs and in a shorter time.

First Alternative Exemplary Embodiment

Figure 7:
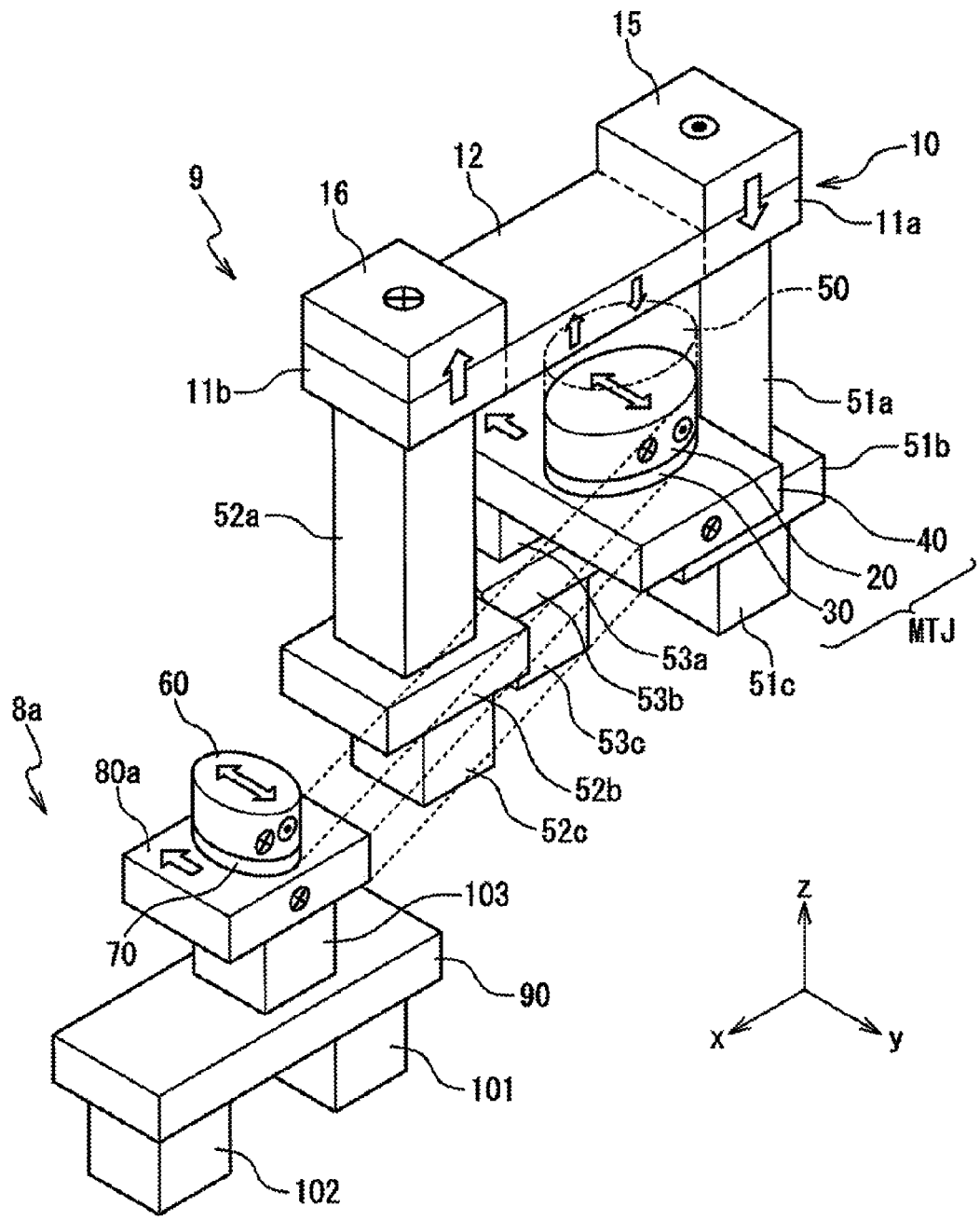
FIG. 7 is a perspective view illustrating a configuration of the magneto-resistance effect elements in respective MRAMs according to a first alternative exemplary embodiment of the present invention.

Next, a configuration of the magneto-resistance effect element in each MRAM according to a first alternative exemplary embodiment of the present invention will be described. FIG. 7 is a perspective view illustrating the configuration of the magneto-resistance effect element in each MRAM according to the first alternative exemplary embodiment of the present invention. The magneto-resistance effect element 8 and the magneto-resistance effect element 9 in the first alternative exemplary embodiment of the present invention are formed on the same chip. In this alternative exemplary embodiment, a configuration of a magneto-resistance effect element 8a for the MRAM 4 for the high-speed operation is different from that of the magneto-resistance effect element 8 in FIG. 2.

The magneto-resistance effect element 8a is a current-induced magnetic field write type magneto-resistance effect element used in a memory cell of the MRAM 4 for the high-speed operation. This magneto-resistance effect element 8a includes the magnetization free layer 60, a magnetization pinned layer 80a, the nonmagnetic layer 70 provided between the magnetization free layer 60 and the magnetization pinned layer 80a and a conductive layer 90 provided in the vicinity of the magnetization free layer 60. Although not shown, it is desired that an electrode layer, an anti-diffusion layer and a ground layer in addition to the above-mentioned layers are provided as appropriate.

The magnetization free layer 60, the magnetization pinned layer 80a and the nonmagnetic layer 70 are the same as the magnetization free layer 60, the magnetization pinned layer 80 and the nonmagnetic layer 70 in FIG. 2. However, the magnetization pinned layer 80a is different from the magnetization pinned layer 80 in FIG. 2 in that the write current does not flow to the magnetization pinned layer 80a.

The conductive layer 90 is a wiring layer for data writing and is formed of a conductor. The orientation of magnetization of the magnetization free layer 63 is controlled by a current-induced magnetic field generated by the write current flowing in the conductive layer 90. In other words, data is written to the magneto-resistance effect element 8a by the current-induced magnetic field. Since the write current is passed to the conductive layer 90 formed of a conductor having a high conductivity such as copper (Cu) or aluminum (Al), not to a magnetization pinned layer (ferromagnetic material), a resistance of a writing wiring line can be further decreased. The conductive layer 90 is electrically connected to the magnetization pinned layer 80a through a contact 103.

Since the other configuration is the same as that in FIG. 2, description thereof is omitted.

Next, a method of writing data to the magneto-resistance effect element 8a in the present exemplary embodiment will be described. First, the write current is passed to the conductive layer 90 from one of a contact 101 and a contact 102 to the other of the contact 101 and the contact 102. The magnetization of the magnetization free layer 60 is switched by the current-induced magnetic field generated by the write current. At this time, the magnetization of the magnetization free layer 60 can be changed to a desired direction by controlling the direction of the current-induced magnetic field by a direction of the write current. Whereby, desired data is recorded to the magnetization free layer 60. Such writing method of passing the write current to the conductive layer 90 may be also referred to as a wiring layer write type because a wiring layer only for writing is provided.

Next, a method of reading data from the magneto-resistance effect element 8a in the present exemplary embodiment will be described. First, the read current is passed in a path including the magnetization free layer 60, the nonmagnetic layer 70, the magnetization pinned layer 80a, the contact 103, the conductive layer 90 and the contact 101 (or the contact 102). Then, data is read by detecting change of a resistance that corresponds to a relative angle between the magnetization of the magnetization pinned layer 80a and the magnetization of the magnetization free layer 60. For example, when the magnetization of the magnetization pinned layer 80a is parallel to the magnetization of the magnetization free layer 60, a low resistance state is achieved, and when the magnetization of the magnetization pinned layer 80a is antiparallel to the magnetization of the magnetization free layer 60, a high resistance state is achieved. The change of resistance of the magneto-resistance effect element 8a is detected as a voltage signal or a current signal and data stored in the magneto-resistance effect element 8a is determined by using the voltage signal or the current signal.

The magneto-resistance effect element 9 is a spin-polarized current write type and current-induced domain wall motion type magneto-resistance effect element used in a memory cell of the MRAM 5 for high integration and large capacity (low current). This magneto-resistance effect element 9 includes the first magnetization free layer 10, the second magnetization free layer 20, the first nonmagnetic layer 33 and the first magnetization pinned layer 40.

This magneto-resistance effect element 9 is the same as the magneto-resistance effect element 9 in FIG. 2. However, contacts 51a, 52a as terminals at both ends of the first magnetization free layer 10 and a contact 53a as a terminal of the first magnetization pinned layer 40 are illustrated in the figure.

These contacts 51a, 52a, 53a are connected to elements and wiring lines in a lower layer through wiring layers 51b, 52b, 53b and contacts 51c, 52c, 53c in a lower layer, respectively.

Since the other configuration, the writing method and the reading method are the same as those in FIG. 2, description thereof is omitted.

The magneto-resistance effect element 8a and the magneto-resistance effect element 9 according to the exemplary embodiment of the present invention are formed on the same chip. The magnetization free layer 60, the nonmagnetic layer 70 and the magnetization pinned layer 80a of the magneto-resistance effect element 8a, and the second magnetization free layer 20, the first nonmagnetic layer 30 and the first magnetization pinned layer 40 of the magneto-resistance effect element 9, respectively, are simultaneously formed on the same layers by using the same materials. The conductive layer 90 and the wiring layers 51b, 52b, 53b are simultaneously formed on the same layer by using the same material. That is, the MRAM 4 and the MRAM 5 can be formed according to the same process and the number of processes does not increase. Whereby, the semiconductor device 1 can be manufactured at lower costs and in a shorter time.

Second Alternative Exemplary Embodiment

Figure 8:
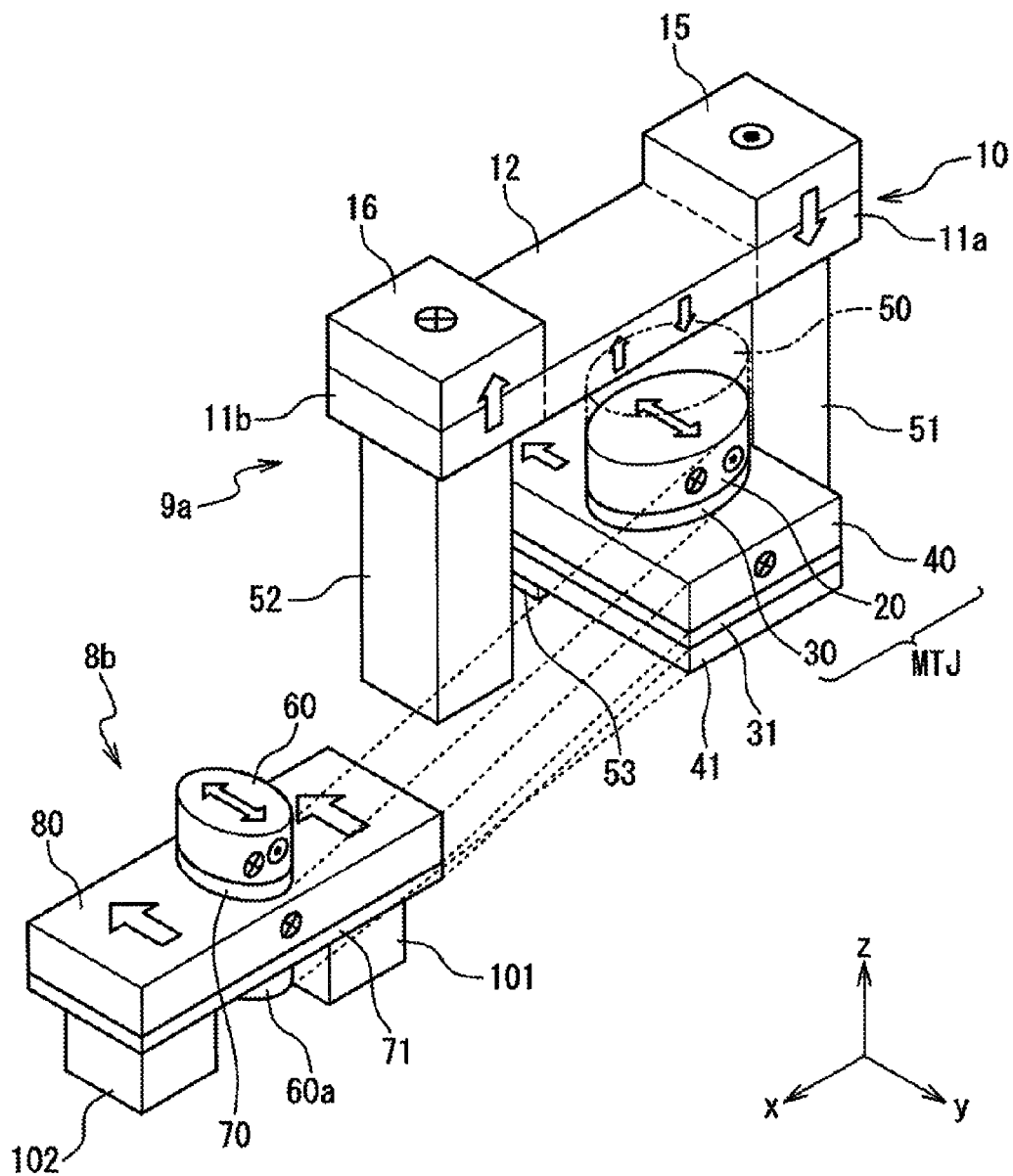
FIG. 8 is a perspective view illustrating a configuration of the magneto-resistance effect elements in respective MRAMs according to a second alternative exemplary embodiment of the present invention.

Next, a configuration of the magneto-resistance effect element in each MRAM according a second alternative exemplary embodiment of the present invention will be described. FIG. 8 is a perspective view illustrating a configuration of the magneto-resistance effect element in each MRAM according to the second alternative exemplary embodiment of the present invention. A magneto-resistance effect element 8b and a magneto-resistance effect element 9a in the second alternative exemplary embodiment of the present invention are formed on the same ship. In this alternative exemplary embodiment, a configuration of the magneto-resistance effect element 8b for the MRAM 4 for the high-speed operation and a configuration of the magneto-resistance effect element 9a for the MRAM 5 for high integration and large capacity (low current) are different from the configuration of the magneto-resistance effect element 8 and the configuration of the magneto-resistance effect element 9 in FIG. 2, respectively.

The magneto-resistance effect element 8b is a current-induced magnetic field write type magneto-resistance effect element used in a memory cell of the MRAM 4 for the high-speed operation. This magneto-resistance effect element 8b includes: the magnetization free layer 60; the magnetization pinned layer 80; the nonmagnetic layer 70 provided between the magnetization free layer 60 and the magnetization pinned layer 80; a nonmagnetic layer 71 provided on an opposite side to the nonmagnetic layer 70 across the magnetization pinned layer 80; and a magnetization free layer 60a provided on an opposite side to the magnetization pinned layer 80 across the nonmagnetic layer 71. Although not shown, it is desired that an electrode layer, an anti-diffusion layer and a ground layer in addition to the above-mentioned layers are provided as appropriate.

The magnetization free layer 60, the magnetization pinned layer 80 and the nonmagnetic layer 70 are the same as the magnetization free layer 60, the magnetization pinned layer 80 and the nonmagnetic layer 70 in FIG. 2. However, the magneto-resistance effect element 8b is different from the magneto-resistance effect element 8 in FIG. 2 in that the nonmagnetic layer 71 and the magnetization free layer 60a provided on an opposite side to the nonmagnetic layer 70 across the magnetization pinned layer 80.

Preferably, the magnetization free layer 60a is formed of the same ferromagnetic material as a material for the magnetization free layer 60, has the same in-plane magnetic anisotropy and the invertible magnetization in the antiparallel direction. The magnetization free layer 60a is magnetically coupled to the magnetization free layer 60 antiferromagnetically to stabilize their magnetizations. The magnetization free layer 60a and the magnetization free layer 60 that are located on both sides across the magnetization pinned layer 80 function to amplify a current-induced magnetic field generated by a write current flowing in the magnetization pinned layer 80 at the writing operation. The nonmagnetic layer 71 acts to disconnect magnetic coupling between the magnetization pinned layer 80 and the magnetization free layer 60a. The nonmagnetic layer 71 may be made of any nonmagnetic material.

Since the other configuration is the same as that in FIG. 2, description thereof is omitted.

Next, since a method of writing data to the magneto-resistance effect element 8b in the present exemplary embodiment is the same as that in FIG. 2 except that the current-induced magnetic field generated by the write current flowing in the magnetization pinned layer 80 is amplified by the magnetization free layer 60a and the magnetization free layer 60 and that the magnetization free layer 60a is magnetized oppositely to the magnetization free layer 60 by the current-induced magnetic field, the description thereof is omitted. Such writing method of locating the magnetization pinned layer 80 as a writing wiring layer between the magnetization free layer 60a and the magnetization free layer 60 and passing the write current to the magnetization pinned layer 80 may be also referred to as an intermediate wiring layer write type.

Since a method of reading data from the magneto-resistance effect element 8b in the present exemplary embodiment is the same as that in FIG. 2, description thereof is omitted.

Although FIG. 8 illustrates that the magnetization free layer 60 and the magnetization free layer 60a have the almost same shape, the shape of the two layers is arbitrary. For example, a shape of the magnetization free layer 60a may be the same as that of the magnetization pinned layer 80. In this case, the magnetization of the magnetization free layer 60a in a steady state is an x direction as its longitudinal direction, and is rotated in a direction of the current-induced magnetic field when a current is introduced to the magnetization pinned layer 80, thereby efficiently applying a magnetic field to the magnetization free layer 60. The magnetization free layer 60a having such function is often referred to as a clad layer or a yoke layer.

The magneto-resistance effect element 9a is a spin-polarized current write type and current-induced domain wall motion type magneto-resistance effect element used in the memory cell of the MRAM 5 for high integration and large capacity (low current). This magneto-resistance effect element 9a includes the first magnetization free layer 10, the second magnetization free layer 20, the first nonmagnetic layer 30, the first magnetization pinned layer 40 and a magnetic layer 41.

The magneto-resistance effect element 9a is the same as the magneto-resistance effect element 9 in FIG. 2. However, the magneto-resistance effect element 9a is different from the magneto-resistance effect element 9 in FIG. 2 in that a nonmagnetic layer 31 and the magnetic layer 41 are provided below the first magnetization pinned layer 40. However, since the magnetic layer 41 and the nonmagnetic layer 31 do not have an effect on the element operation, these layers may be omitted.

Contacts 51, 52 as terminals at both ends of the first magnetization free layer 10 and a contact 53 as a terminal of the first magnetization pinned layer 40 are illustrated in the figure. These contacts 51, 52, 53 are connected to respective elements and wiring lines in a lower layer.

Since the other configuration and operation are the same as those in FIG. 2, description thereof is omitted.

The magneto-resistance effect element 8b and the magneto-resistance effect element 9a according to the exemplary embodiment of the present invention are formed on the same chip. Then, the magnetization free layer 60, the nonmagnetic layer 70, the magnetization pinned layer 80 and the magnetization free layer 60a of the magneto-resistance effect element 8b, and the second magnetization free layer 20, the first nonmagnetic layer 30, the magnetization pinned layer 40 and the magnetic layer 41 of the magneto-resistance effect element 9a, respectively, are simultaneously formed on the same layers by using the same materials. That is, the MRAM 4 and the MRAM 5 can be formed according to the same process and the number of processes does not increase. Whereby, the semiconductor device 1 can be manufactured at lower costs and in a shorter time.

Third Alternative Exemplary Embodiment

Figure 9A:
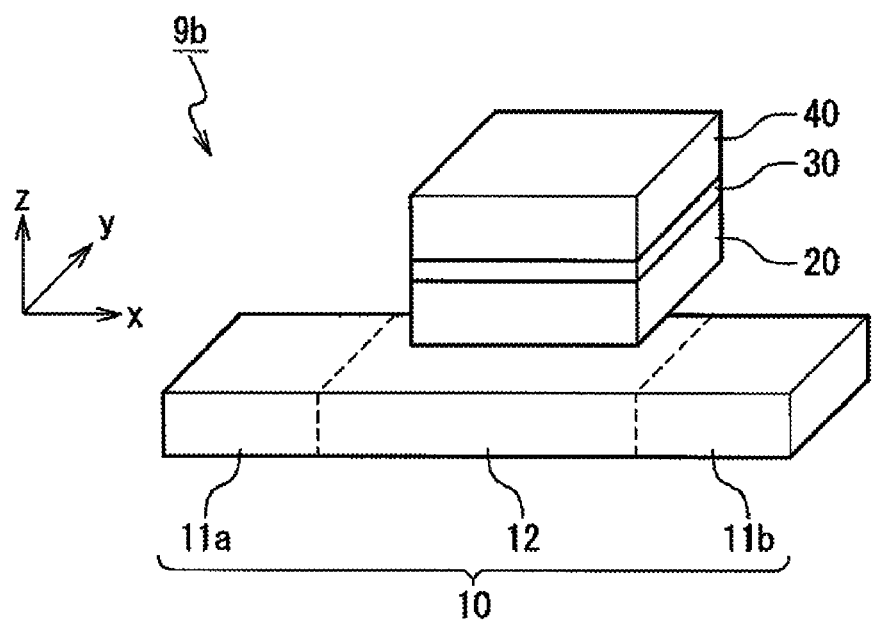
FIG. 9A is a perspective view illustrating a structure of a main part of the magneto-resistance effect element according to a third alternative exemplary embodiment of the present invention.
Figure 9B:
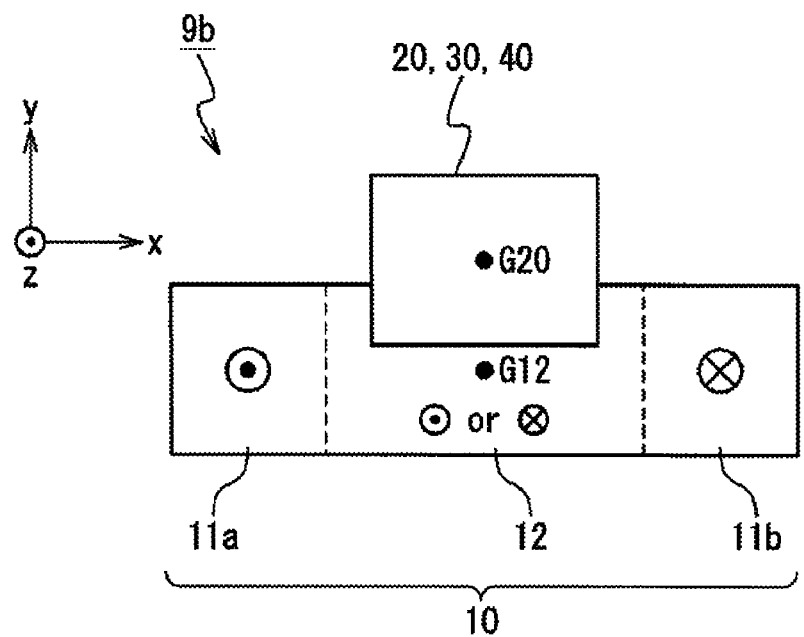
FIG. 9B is a plan view illustrating a structure of the main part of the magneto-resistance effect element according to the third alternative exemplary embodiment of the present invention.
Figure 9C:
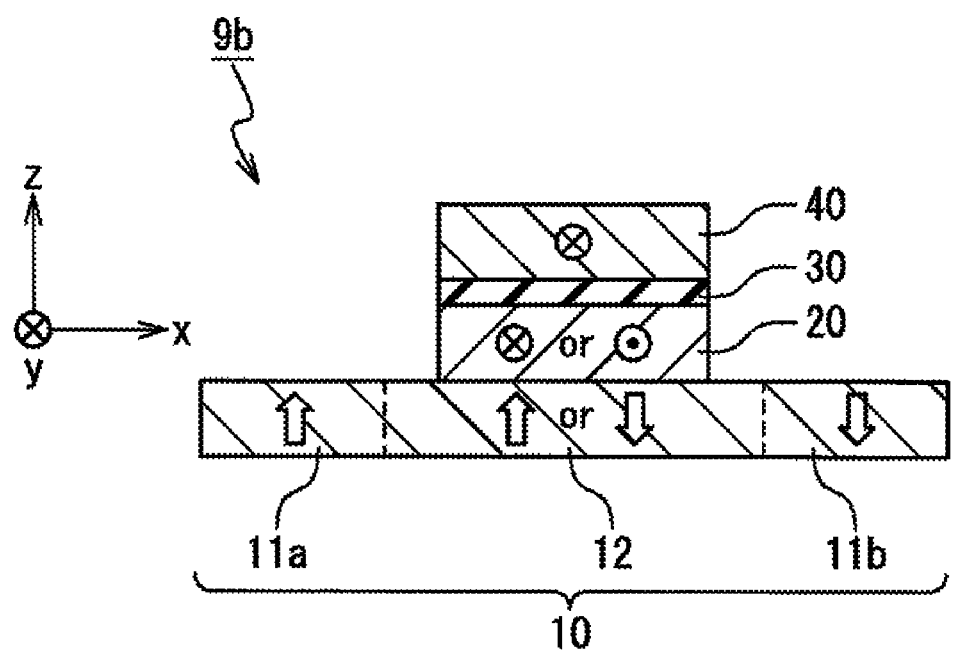
FIG. 9C is a sectional view illustrating a structure of the main part of the magneto-resistance effect element according to the third alternative exemplary embodiment of the present invention.
Figure 9D:
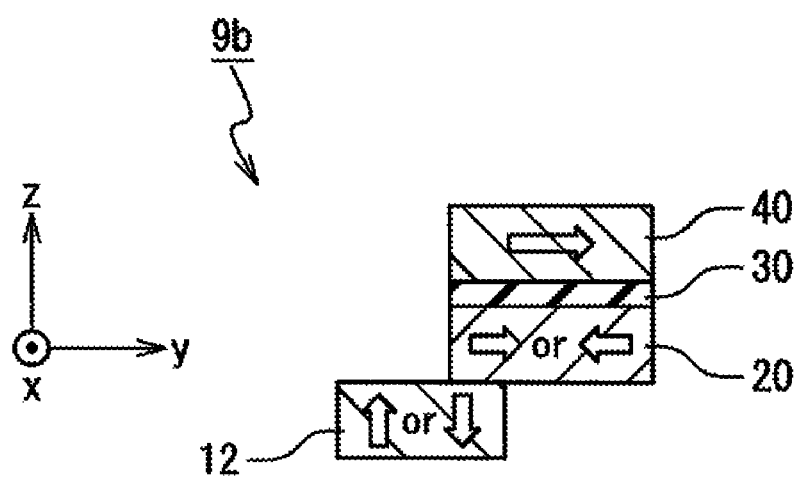
FIG. 9D is a sectional view illustrating a structure of the main part of the magneto-resistance effect element according to the third alternative exemplary embodiment of the present invention.

Next, a configuration of the magneto-resistance effect element in each MRAM according to a third alternative exemplary embodiment of the present invention will be described. FIGS. 9A to 9D are schematic views schematically illustrating the configuration of the magneto-resistance effect element in the third alternative exemplary embodiment. Describing in detail, FIG. 9A is a perspective view, FIGS. 9B, 9C and 9D are an xy plan view, an xz sectional view and a yz sectional view in an xyz coordinate system shown in FIG. 9A, respectively.

The magneto-resistance effect element 9a is a spin-polarized current write type and current-induced domain wall motion type magneto-resistance effect element used in a memory cell of the MRAM 5 for high integration and large capacity (low current). A magneto-resistance effect element 9b in FIGS. 9A to 9D is obtained by vertically inverting the magneto-resistance effect element 9 in FIGS. 3A to 3D. In other words, the third alternative exemplary embodiment is different from the exemplary embodiments shown in FIGS. 3A to 3D (FIG. 2) in that the order of laminating the layers is inverted from the order in FIG. 3A to FIG. 3D (FIG. 2).

Although the shape of the second magnetization free layer 20 and the first nonmagnetic layer 30 is changed from a cylindrical shape to a rectangular parallelepiped shape and the conductive layer 50 is omitted, even when such change is made, the magneto-resistance effect element 9b in FIG. 9A to FIG. 9D can perform similar functions and operations to those of the magneto-resistance effect element 9 in FIGS. 3A to 3D.

In the magneto-resistance effect element in the present exemplary embodiment, the second magnetization free layer 20, the first nonmagnetic layer 30 and the first magnetization pinned layer 40 only need to be provided adjacent to one another in this order, and the order of laminating these layers and the first magnetization free layer 10 (and the magnetization pinned layer 15, the magnetization pinned layer 16: not shown) is arbitrary. Accordingly, as shown in FIGS. 9A to 9D, the first magnetization free layer 10 may be formed on a lowermost plane. Also in the case, it is required that the center of gravity of the magnetization free region 12 is shifted from the center of gravity of the second magnetization free layer 20 in the xy plane (FIG. 9B), positional relationship and magnitude relationship are arbitrary.

In this alternative exemplary embodiment, by vertically inverting the magneto-resistance effect element 8 for the MRAM 4 in FIG. 2, the semiconductor device 1 can be configured having the similar combination to that in FIG. 2. That is, the vertically inverted magneto-resistance effect element 8 and magneto-resistance effect element 9b in this alternative exemplary embodiment are formed on the same chip. Then, the magnetization free layer 60, the nonmagnetic layer 70 and the magnetization pinned layer 80 of the magneto-resistance effect element 8, and the second magnetization free layer 20, the first nonmagnetic layer 30 and the first magnetization pinned layer 40 of the magneto-resistance effect element 9b, respectively, are simultaneously formed on the same layers by using the same materials. That is, the MRAM 4 and the MRAM 5 can be formed according to the same process and the number of processes does not increase. Whereby, the semiconductor device 1 can be manufactured at lower costs and in a shorter time.

In a similar manner, by vertically inverting the magneto-resistance effect element 8a for the MRAM 4 in FIG. 7, the semiconductor device 1 can be configured having the similar combination to that in FIG. 7. Similarly, by vertically inverting the magneto-resistance effect element 8b for the MRAM 4 in FIG. 8, the semiconductor device 1 can be configured having the similar combination to that in FIG. 8. Also in these cases, formation according to the same process is possible.

Fourth Alternative Exemplary Embodiment

Figure 10A:
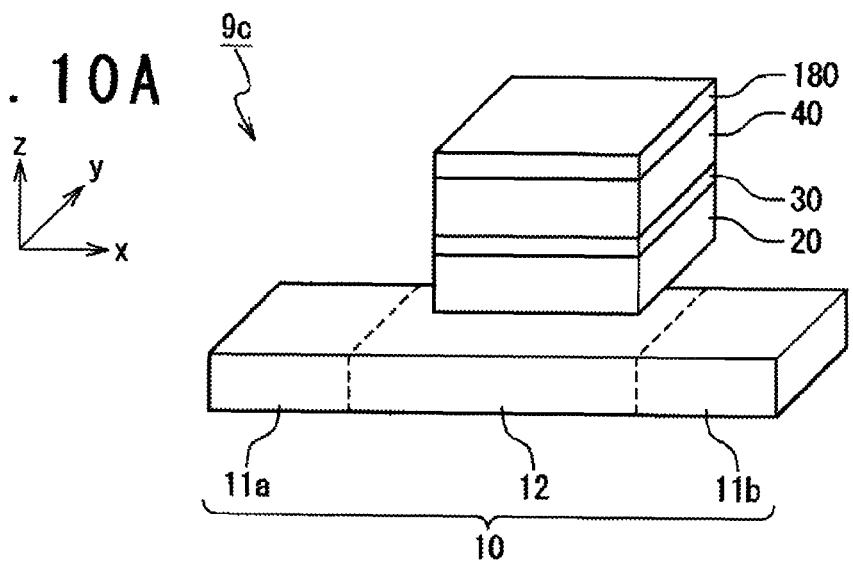
FIG. 10A is a perspective view illustrating a structure of a main part of the magneto-resistance effect element according to a fourth alternative exemplary embodiment of the present invention.
Figure 10B:
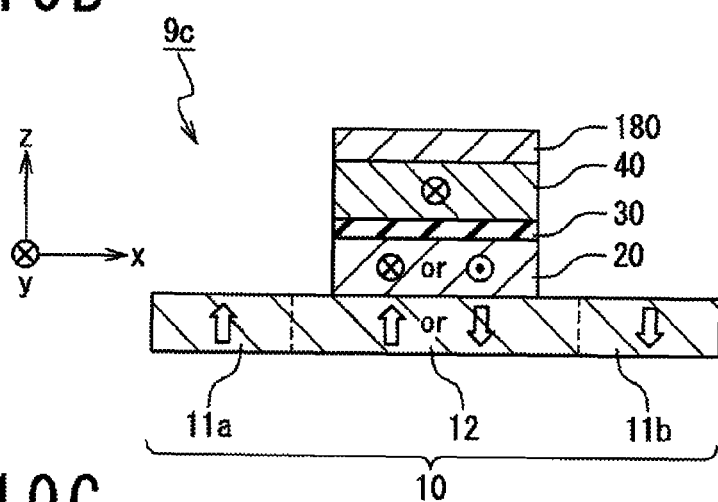
FIG. 10B is a sectional view illustrating a structure of the main part of the magneto-resistance effect element according to the fourth alternative exemplary embodiment of the present invention.
Figure 10C:
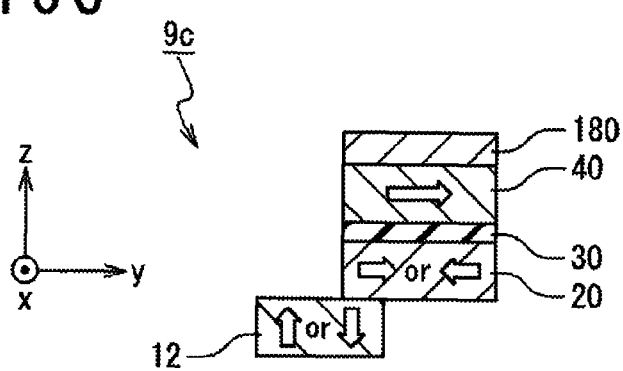
FIG. 10C is a sectional view illustrating a structure of the main part of the magneto-resistance effect element according to the fourth alternative exemplary embodiment of the present invention.

Next, a configuration of the magneto-resistance effect element in each MRAM according to a fourth alternative exemplary embodiment of the present invention will be described. FIGS. 10A to 10C are schematic view schematically illustrating a configuration of the magneto-resistance effect element in the fourth alternative exemplary embodiment. FIG. 10A is a perspective view, FIG. 10B is an xz sectional view and FIG. 10C is a yz sectional view. In the fourth alternative exemplary embodiment, a pinning layer 180 bonded to the first magnetization pinned layer 40 is provided on the third alternative exemplary embodiment.

In a magneto-resistance effect element 9c in the present exemplary embodiment, the pinning layer 180 is bonded to at least a part of the first magnetization pinned layer 40. Whereby, the pinned magnetization of the first magnetization pinned layer 40 that is substantially pinned to a certain direction can be further stabilized. For example, an anti-ferromagnetic material such as Pt—Mn is used as a material for the pinning layer 180.

In this alternative exemplary embodiment, a pinning layer may be simultaneously formed on a part of the magnetization pinned layer 80 of the vertically inverted magneto-resistance effect element 8 for the MRAM 4 in FIG. 2 on the same layer as the pinning layer 180 by using the same material. Also in this case, the MRAM 4 and the MRAM 5 can be formed according to the same process and the number of processes does not increase. Whereby, the semiconductor device 1 can be manufactured at lower costs and in a shorter time.

Similarly, by vertically inverting the magneto-resistance effect element 8a for the MRAM 4 in FIG. 7 and providing a pinning layer, the semiconductor device 1 can be configured having the similar combination to that in FIG. 7. Similarly, by vertically inverting the magneto-resistance effect element 8b for the MRAM 4 in FIG. 8 and providing a pinning layer, the semiconductor device 1 can be configured having the similar combination to that in FIG. 8. Also in these cases, formation according to the same process is possible.

Fifth Alternative Exemplary Embodiment

Figure 11A:
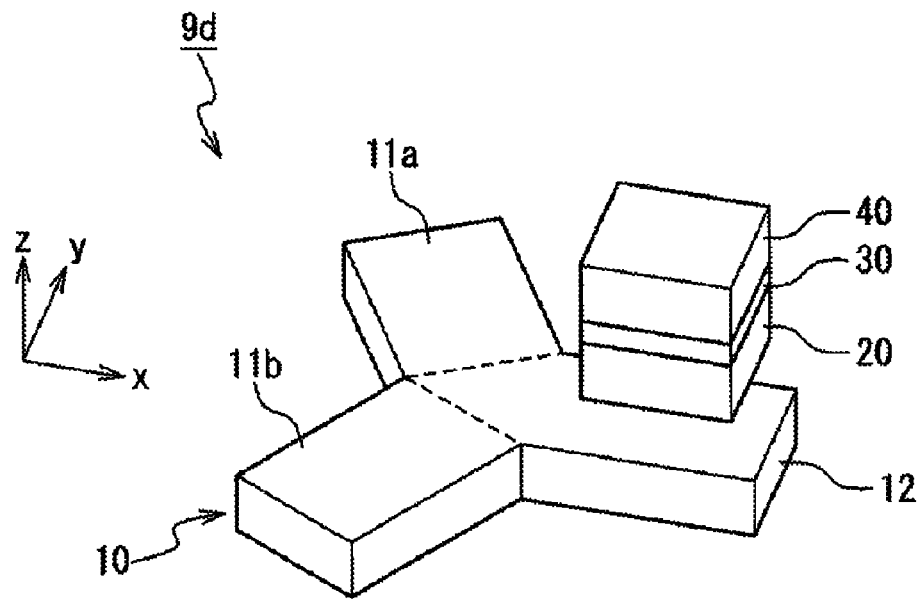
FIG. 11A is a perspective view illustrating a structure of a main part of the magneto-resistance effect element according to a fifth alternative exemplary embodiment of the present invention.
Figure 11B:
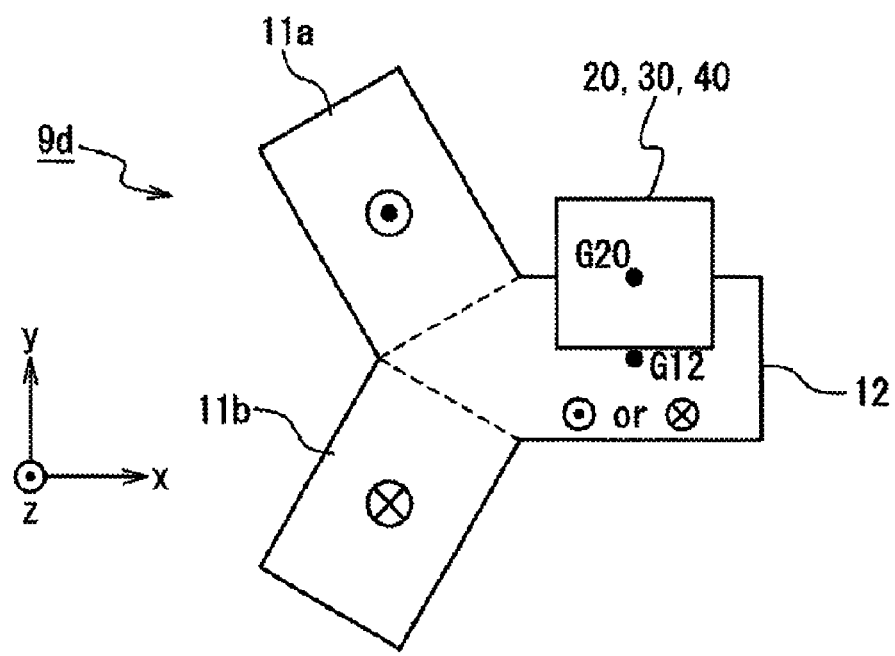
FIG. 11B is a plan view illustrating a structure of the main part of the magneto-resistance effect element according to the fifth alternative exemplary embodiment of the present invention.

Next, a configuration of the magneto-resistance effect element in each MRAM according to a fifth alternative exemplary embodiment of the present invention will be described. FIGS. 11A to 11B are schematic views schematically illustrating the configuration of the magneto-resistance effect element in the fifth alternative exemplary embodiment. FIG. 11A is a perspective view and FIG. 11B is an xy plan view.

A magneto-resistance effect element 9d is a spin-polarized current write type current-induced domain wall motion type magneto-resistance effect element used in the memory cell in the MRAM 5 for high integration and large capacity (low current).

Also in the magneto-resistance effect element 9d as shown in FIGS. 11A, 11B, the first magnetization free layer 10 is formed of the first magnetization pinned region 11a, the second magnetization pinned region 11b and the magnetization free region 12. However, one end of the magnetization free region 12 is connected with the first magnetization pinned region 11a and the second magnetization pinned region 11b rather than connecting the first magnetization pinned region 11a to one end of the magnetization free region 12 and connecting the second magnetization pinned region 11b to the other end of the magnetization free region 12 as shown in FIGS. 3A to 3D. That is, the first magnetization pinned region 11a, the second magnetization pinned region 11b and the magnetization free region 12 constitute a shape of a "junction of three streets" (three-forked road, substantially Y-shaped). Also in the magneto-resistance effect element 9d, positional relationship and magnetic characteristics of the layers are as described above. In other words, the first magnetization free layer 10 has magnetic anisotropy in a film thickness direction, while the second magnetization free layer 20 and the first magnetization pinned layer 40 has in-plane magnetic anisotropy. The center of gravity G20 of the second magnetization free layer 20 is provided so as to be shifted from the center of gravity G12 of the magnetization free region 12 in an xy plane. The magnetizations of the first magnetization pinned region 11a and the second magnetization pinned region 11b that constitute the first magnetization free layer 10 are pinned to be antiparallel to each other in the film thickness direction. Also in this magneto-resistance effect element 9d, as shown in FIG. 2, the magnetization pinned layer 15 and/or the magnetization pinned layer 16 may be provided so as to be magnetically coupled to the first magnetization free layer 10.

The magneto-resistance effect element 9d shown in FIGS. 11A and 11B is a four-terminal element. One of four terminals is provided on the first magnetization pinned layer 40, other two terminals are provided in the first magnetization pinned region 11a and the second magnetization pinned region 11b and one remaining terminal is provided in the magnetization free region 12. Also in this magneto-resistance effect element 9d, a domain wall is formed in the vicinity of either a boundary between the first magnetization pinned region 11a and the magnetization free region 12 or a boundary between the second magnetization pinned region 11b and the magnetization free region 12. In this magneto-resistance effect element 9d, writing is performed by passing a current between the first magnetization pinned region 11a and the magnetization free region 12 or between the second magnetization pinned region 11b and the magnetization free region 12. In this case, the domain wall starts from the boundary between the first magnetization pinned region 11a or the second magnetization pinned region 11b and the magnetization free region 12, and goes out from the other end of the magnetization free region 12, thereby performing writing.

Figure 12A:
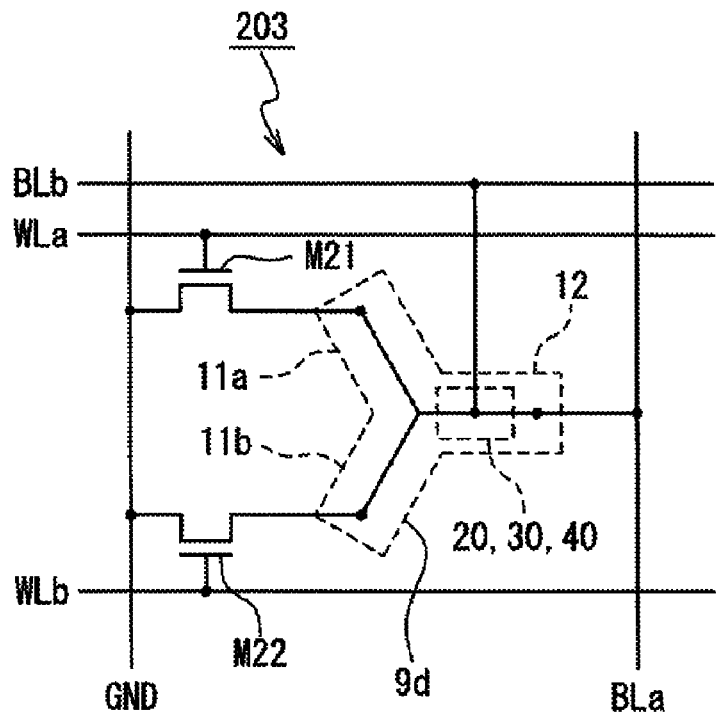
FIG. 12A is a circuit diagram illustrating an example of a configuration of a memory cell in which the magneto-resistance effect element according to the fifth alternative exemplary embodiment of the present invention is integrated.
Figure 12B:
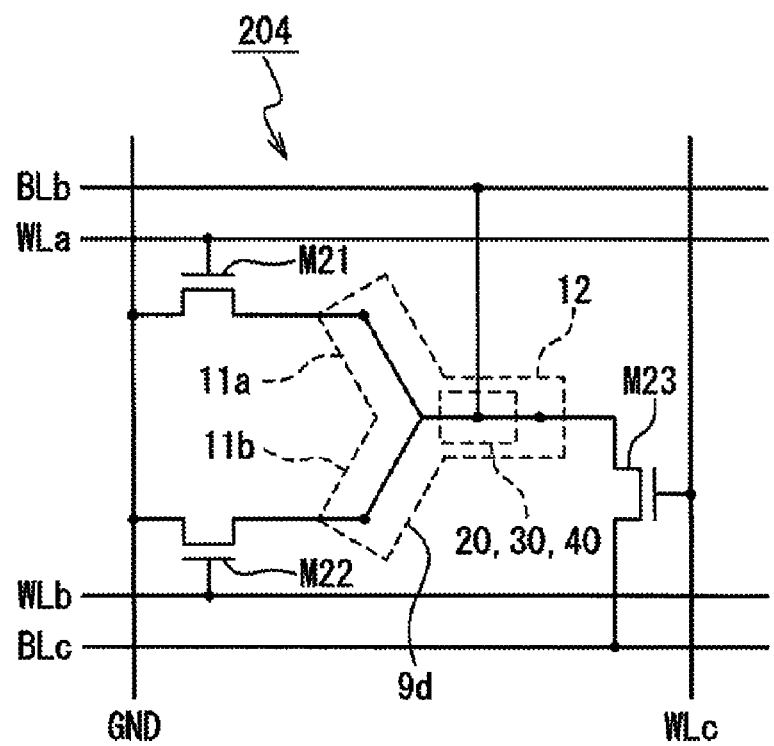
FIG. 12B is a circuit diagram illustrating another example of a configuration of the memory cell in which the magneto-resistance effect element according to the fifth alternative exemplary embodiment of the present invention is integrated.

FIGS. 12A to 12B are circuit diagram illustrating examples of a configuration of a memory cell in which the magneto-resistance effect element in the fifth alternative exemplary embodiment is integrated. These figures illustrate two examples of a circuit configuration adopted when the magneto-resistance effect element 9d has configurations shown in FIGS. 11A and 11B.

In FIG. 12A, two MOS transistors M21, M22 are provided in one memory cell 203. One source/drain of the MOS transistor M21 is connected to the ground line GND and the other source/drain is connected to one end of the first magnetization pinned region 11a (on an opposite side of the boundary with the magnetization free region 12). One source/drain of the MOS transistor M22 is connected to the ground line GND and the other is connected to one end of the second magnetization pinned region 11b (on an opposite side of the boundary with the magnetization free region 12). A gate of the MOS transistor M21 is connected to a word line WLa and a gate of the MOS transistor M22 is connected to a word line WLb.

A bit line BLa is connected to an end of the magnetization free region 12 (on the opposite side of the boundary with the first magnetization pinned region 11a and the second magnetization pinned region 11b). The bit line BLa is a writing wiring for supplying a write current to the first magnetization free layer 10. A bit line BLb is connected to the first magnetization pinned layer 40 as one end of MTJ. This bit line BLb is a reading wiring for supplying the read current to the MTJ.

In the circuit configuration as shown in FIG. 12A, data can be distinguished in writing depending on which of the word line WLa and the word line WLb is pulled up to a "high" level and which is pulled down to a "Low" level. For example, when the word line WLa is set to a "Low" level, the word line WLb is set to a "high" level, the bit line BLa is set to a "high" level and the ground line GND is set to a "Low" level, the MOS transistor M21 is turned "OFF", while the MOS transistor M22 is turned "ON". As a result, the write current flows from the bit line BLa to the ground line GND through the magnetization free region 12, the second magnetization pinned region 11b and the MOS transistor M22. When the word line WLb is set to a "Low" level, the word line WLa is set to a "high" level, the bit line BLa is set to a "high" level and the ground line GND is set to a "Low" level, the MOS transistor M22 is turned "OFF" and the MOS transistor M21 is turned "ON". As a result, the write current flows from the bit line BLa to the ground line GND through the magnetization free region 12, the first magnetization pinned region 11a and the MOS transistor M21. In this manner, data can be distinguished in writing.

Data can be read, for example, according to a below-mentioned first method. According to the first method, the word line WLa and the word line WLb are set to "Low", the bit line BLb is set to "high" and the bit line BLa is set to "Ground". At this time, the MOS transistors M21, M22 are turned "OFF" and a current passes through MTJ from the bit line BLb to the bit line BLa. Whereby, the resistance of the MTJ can be read, enabling reading of data from a magneto-resistance effect element. In this case, information on the cell of an intersection between the bit line BLa and the bit line BLb is read, that is, cross-point reading is performed.

Data may be read from the memory cell 203 shown in FIG. 12A according to a below-mentioned second method. First, the word line WLa is set to a "high" level and the word line WLb is set to a "Low" level, thereby turning "ON" the MOS transistor M21 and turning "OFF" the MOS transistor M22. The ground line GND is set to a "Low" level and the bit line BLb is set to a "high" level. Further, the bit line BLa is set to a suitable potential. At this time, the read current flows through the MTJ from the bit line BLb to the ground Line GND via the MOS transistor M21 without flowing to the bit line BLa. This also enables reading of a resistance value of the MTJ. According to a second method, as distinct from reading according to the first method, one memory cell is selected by the MOS transistor M21, enabling reading at high speed.

In the present exemplary embodiment, the other circuit configuration as shown in FIG. 12B may be used. FIG. 12B is different from FIG. 12A in that three MOS transistors are provided in a memory cell 204 in FIG. 12B. Specifically, one source/drain of a MOS transistor M23 is connected to an end of the magnetization free region 12 (on an opposite side to the first magnetization pinned region 11a and the second magnetization pinned region 11b) and the other source/drain of the MOS transistor M23 is connected to a bit line BLc. A gate of the MOS transistor M23 is connected to a word line WLc.

Also in the memory cell 203 shown in FIG. 12B, data can be distinguished in writing depending on which of the first word line WLa and the word line WLb is set to a "Low" level and which is set to a "high" level. For example, when the word line WLa is set to a "Low" level, the word line WLb is set to a "high" level and the word line WLc is set to a "high" level, the MOS transistor M21 is turned "OFF", the MOS transistor M22 is turned "ON" and the MOS transistor M23 is turned "ON". Here, when the bit line BLc is set to a "high" level and the ground line GND is set to a "Low" level, the write current flows from the bit line BLc to the ground line GND through the MOS transistor M23, the magnetization free region 12, the second magnetization pinned region 11b and the MOS transistor M22. When the word line WLb is set to a "Low" level, the word line WLa is set to "high" and the word line WLc is set to "high", the MOS transistor M22 is turned "OFF", the MOS transistor M21 is turned "ON" and the MOS transistor M23 is turned "ON". Here, when the bit line BLc is set to a "high" level and the ground line GND is set to a "Low" level, the write current flows from the bit line BLc to the ground line GND through the MOS transistor M23, the magnetization free region 12, the first magnetization pinned region 11a and the MOS transistor M21. As described above, data can be distinguished in writing.

Data can be read from the memory cell 203 shown in FIG. 12B, for example, in a following manner. First, the word line WLa is set to a "Low" level, the word line WLb is set to a "Low" level and the word line WLc is set to a "high" level. At this time, the MOS transistors M21, M22 are turned "OFF" and the MOS transistor M23 is turned "ON". Here, by setting the bit line BLb to a "high" level and the bit line BLc to "Low", the read current flows through the MTJ from the bit line BLb to the bit line BLc via the MOS transistor M23. Whereby, data can be read.

A circuit configuration and circuit operation described herein are merely examples and even when the other circuit configuration and circuit setting are employed, the magneto-resistance effect element 9d shown in FIGS. 11A and 11B can be integrated in the memory cell 203.

In this alternative exemplary embodiment, by vertically inverting the magneto-resistance effect element 8 for the MRAM 4 in FIG. 2, the semiconductor device 1 can be configured having the similar combination to that in FIG. 2. That is, the vertically converted magneto-resistance effect element 8 and magneto-resistance effect element 9d in this alternative exemplary embodiment are formed on the same ship. In other words, the MRAM 4 and the MRAM 5 can be formed according to the same process and the number of processes does not increase. Whereby, the semiconductor device 1 can be manufactured at lower costs and in a shorter time.

Similarly, by vertically inverting the magneto-resistance effect element 8a for the MRAM 4 in FIG. 7, the semiconductor device 1 can be configured having the similar combination to that in FIG. 7. Similarly, by vertically inverting the magneto-resistance effect element 8b for the MRAM 4 in FIG. 8, the semiconductor device 1 can be configured having the similar combination to that in FIG. 8. Also in these cases, a formation according to the same process is possible.

Sixth Alternative Exemplary Embodiment

Figure 13:
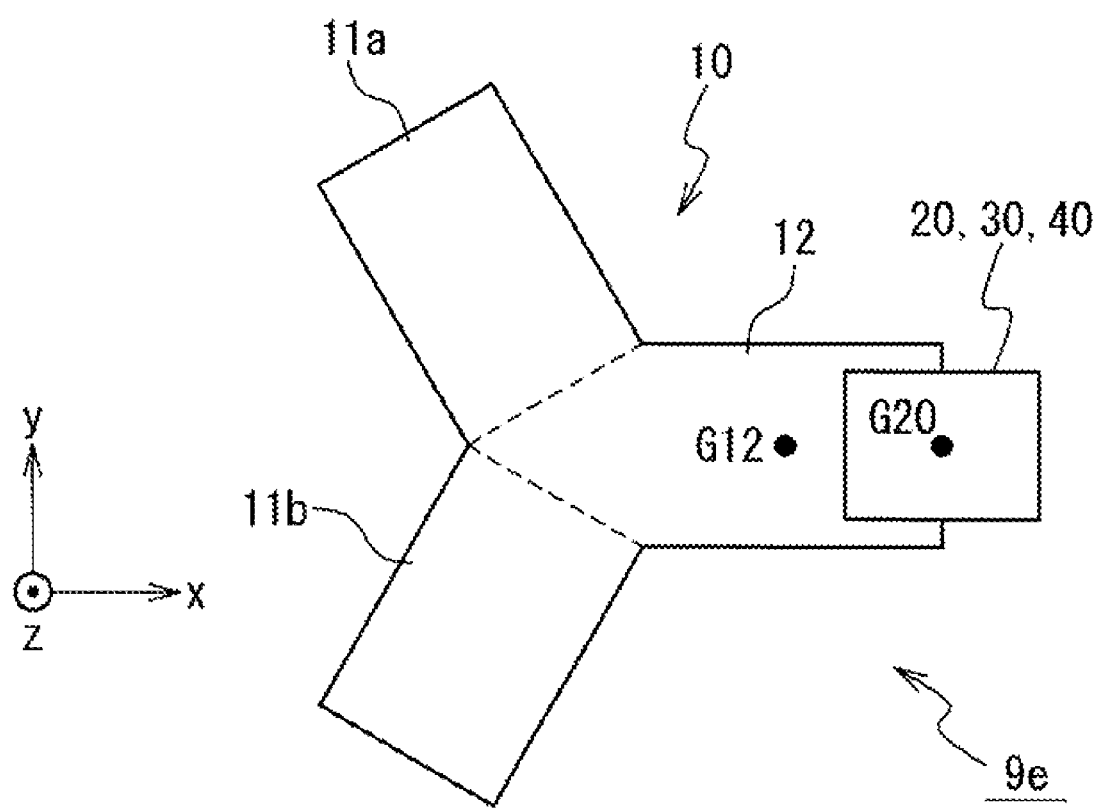
FIG. 13 is a plan view schematically illustrating a configuration of the magneto-resistance effect element according to a sixth alternative exemplary embodiment of the present invention.

FIG. 13 is a plan view schematically illustrating a configuration of the magneto-resistance effect element in a sixth alternative exemplary embodiment. The present exemplary embodiment is different from the fifth alternative exemplary embodiment in that, as compared to the magneto-resistance effect element 9d in the fifth alternative exemplary embodiment, the center of gravity G20 of the second magnetization free layer 20 is shifted from the center of gravity G12 of the magnetization free region 12 of the first magnetization free layer 10 in a certain in-plane direction (the direction parallel to the xy plane). Although the above-mentioned figures illustrate the certain direction that is substantially parallel to the +y direction, the certain direction may be arbitrary determined. Therefore, as shown in FIG. 13, the certain direction may have an x component. In the case where the first magnetization free layer 10 is configured so as to constitute a shape of a "junction of three streets" (three-forked road, substantially Y-shaped) as described with reference to FIG. 11A and 11B, positional relationship between the center of gravity G20 of the second magnetization free layer 20 and the center of gravity G12 of the magnetization free region 12 as shown in FIG. 13 is acceptable.

Since the other configuration and operation are the same as those in the fifth alternative exemplary embodiment, description thereof is omitted.

Although the exemplary embodiments and the various alternative exemplary embodiments have been described, the present invention must not be interpreted only from the above-mentioned exemplary embodiments and alternative exemplary embodiments. Those skilled in the art could easily understand that the above-mentioned alternative exemplary embodiments can be used in combination unless a contradiction arises.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The semiconductor device of the present invention as the memory-embedded semiconductor device can achieve both the high-speed processing and the large capacity processing in an internal memory.

The invention claimed is:

1. A semiconductor device comprising:
a first magnetic random access memory configured to include a first memory cell; and
a second magnetic random access memory configured to include a second memory cell operating at higher speed than said first memory cell and is provided on the same chip together with said first magnetic random access memory,
wherein said first memory cell includes:
a first magnetization free layer,
a second magnetization free layer,
a first nonmagnetic layer configured to be provided adjacent to said second magnetization free layer, and
a first magnetization pinned layer configured to be provided adjacent to said first nonmagnetic layer and on an opposite side to said second magnetization free layer,
wherein said first magnetization free layer is formed of a ferromagnetic material and has magnetic anisotropy in a film thickness direction,
wherein each of said second magnetization free layer and said first magnetization pinned layer is formed of a ferromagnetic material and has in-plane magnetic anisotropy,
wherein said first magnetization free layer includes:
a first magnetization pinned region configured to have pinned magnetization,
a second magnetization pinned region configured to have pinned magnetization, and
a magnetization free region configured to be connected to said first magnetization pinned region and said second magnetization pinned region and have invertible magnetization,
wherein said magnetization free region is magnetically coupled to said second magnetization free layer,
wherein a center of gravity of said magnetization free region is shifted from a center of gravity of said second magnetization free layer in a certain direction as an in-plane direction,
wherein said magnetization of said first magnetization pinned layer is pinned to a direction substantially parallel to said certain direction,
wherein said second memory cell includes:
a third magnetization free layer,
a third magnetization pinned layer, and
a second nonmagnetic layer provided between said third magnetization free layer and said third magnetization pinned layer,
wherein each of said third magnetization free layer and said third magnetization pinned layer is formed of a ferromagnetic material.

2. The semiconductor device according to claim 1, wherein said each of said third magnetization free layer and said third magnetization pinned layer has in-plane magnetic anisotropy,
wherein said second magnetization free layer and said third magnetization free layer are formed on a same layer, and
wherein said first magnetization pinned layer and said third magnetization pinned layer are formed on another same layer.

3. The semiconductor device according to claim 2, wherein a write current flows through said first magnetization free layer in said first memory cell and does not flow through said second magnetization free layer.

4. The semiconductor device according to claim 1, wherein a write current flows through said third magnetization pinned layer in said second memory cell.

5. The semiconductor device according to claim 1, wherein said second memory cell further includes:
a write wiring line configured to be provided in the vicinity of said third magnetization free layer and be passed by a write current.

6. The semiconductor device according to claim 1, wherein said second memory cell further includes:
a fourth magnetization free layer configured to be provided on an opposite side to said second nonmagnetic layer across said third magnetization pinned layer and be formed of a ferromagnetic material.

7. The semiconductor device according to any claim 1, wherein said first memory cell further includes:
a conductive layer configured to be provided between said first magnetization free layer and said second magnetization free layer.

8. The semiconductor device according to claim 1, wherein said first memory cell further includes:
a first auxiliary magnetization pinned layer configured to be connected to one of said first magnetization pinned region and said second magnetization pinned region.

9. The semiconductor device according to claim 8, wherein said first memory cell further includes:
a second auxiliary magnetization pinned layer configured to be connected to the other of said first magnetization pinned region and said second magnetization pinned region.

10. The semiconductor device according to claim 1, wherein said first magnetization pinned region is provided adjacent to one end of said magnetization free region, and
wherein said second magnetization pinned region is provided adjacent to the other end of said magnetization free region.

11. The semiconductor device according to claim 1, wherein said first magnetization pinned region is provided adjacent to one end of said magnetization free region,
wherein said second magnetization pinned region is provided adjacent to said one end of said magnetization free region, and
wherein said first magnetization pinned region, said second magnetization pinned region and said magnetization free region constitute a shape of a junction of three streets.

12. The semiconductor device according to claim 7, wherein said conductive layer contains at least one element selected from Fe, Co and Ni.

13. The semiconductor device according to claim 1, wherein said first nonmagnetic layer contains MgO.

14. The semiconductor device according to claim 1, wherein at least one of said second magnetization free layer and said first magnetization pinned layer contains Co—Fe—B.

* * * * *